United States Patent [19]

Balakrishnan

[11] Patent Number: 5,122,691

[45] Date of Patent: Jun. 16, 1992

[54] INTEGRATED BACKPLANE INTERCONNECTION ARCHITECTURE

[76] Inventor: Balu Balakrishnan, 20745 Granada Ct., Saratoga, Calif. 95070

[21] Appl. No.: 616,580

[22] Filed: Nov. 21, 1990

[51] Int. Cl.⁵ .................... H04Q 11/04; H04J 3/12; H04L 7/08; H04L 12/40

[52] U.S. Cl. .................... 307/475; 370/58.2; 370/110.1; 370/85.9; 361/413

[58] Field of Search .................... 307/475; 361/413; 439/61, 62; 370/85.1, 85.5, 85.6, 85.7, 85.9, 85.15, 58.1, 58.2, 58.3, 108, 60.1, 60, 110.1

[56] References Cited

U.S. PATENT DOCUMENTS

| | | | |
|---|---|---|---|
| 4,697,858 | 10/1987 | Balakrishnan | 361/413 X |
| 4,875,206 | 10/1989 | Nichols et al. | 370/85.15 |
| 4,899,333 | 2/1990 | Roediger | 370/60 |
| 4,955,020 | 9/1990 | Stone et al. | 370/85.9 |
| 5,051,982 | 9/1991 | Brown et al. | 370/58.2 |

Primary Examiner—Edward P. Westin
Assistant Examiner—David R. Bertleson
Attorney, Agent, or Firm—Douglas L. Weller

[57] ABSTRACT

A backplane, provides a physical layer level interconnection between a plurality of modules. The backplane includes a physical layer inplementation of an interconnection topology incorporated within one or more integrated circuits called interconnect chips. Incorporated on the interconnect chips are interconnect drivers and interconnect receivers for the physical layer implementation of the interconnection topology. These interconnect drivers and interconnect receivers provide point-to-point links between the physical layer implementation of the interconnection topology and the plurality of modules. Each point-to-point link may include two separate point-to-point link lines, one for an interconnect driver and one for an interconnect receiver. For the bus interconnection topology, alternately, each point-to-point link may be tri-level, including only a single point-to-point link line. The interconnection topology may be, for example, a bus topology, a ring topology or a circuit switched topology.

39 Claims, 22 Drawing Sheets

INTEGRATED BACKPLANE INTERCONNECTION ARCHITECTURE

BACKGROUND

The present invention concerns an improved physical layer architecture for use in a computer system. The invention is particularly useful for enchancing the performance of a physical layer implementing a bus topology, but may also be used to enhance performance of other interconnection topologies as a ring topology or a circuit switched topology.

In computer systems, a bus is an interconnection topology commonly used to communicate between logical blocks or modules. The modules connect to a common media, such as a set of printed circuit board traces of wires. The rules that govern the access of modules to the bus and the data trransfer constitute the bus protocol. Generally, all modules on a bus must use the same protocol.

A typical implementation of a bus consists of a set of traces embedded in print circuit (PC) board. Modules connect to the bus through bus transceivers. Modules connected to a bus may all reside on the same PC board. Alternately, modules of a bus may reside on separate PC boards and be attached to the electro-mechanical structure that incorporates the physical media of the bus through a series of connectors. The electro-mechanical structure that incorporates the physical media of the bus is called a bus backplane. Various standards have been developed which defined the physical features of the backplane and the bus protocols. These bus standards include VME, Futurebus, Multibus, Nubus. The use of such bus standards allows for end users to configure their own computer systems on a single bus backplane to be able to use a variety of modules designed by many different vendors.

Typically in the physical architecture of a microcomputer, the bus backplane is incorporated on the main PC board, called the mother board, that houses the logic for the microcomputer. Plug-in modules, some of which are referred to as daughter boards, are attached to the mother board using connectors. The plug-in modules may include, for example, PC boards which include memory, a controller for a disk drive, a controller for an interface to a physical layer of an interconnection topology, logic that controls a serial port and/or logic that controls a parallel port.

In general, for communication between the modules of a computer system, bus topologies are preferred to other topologies such as ring topologies or switched topologies for a number of reasons. For example, Bus protocols are generally much simpler than protocols for other topologies. Also, bus topologies are highly configurable. That is, each slot position on a bus to which a module may be added is equally connected to modules on all other slots on the bus. Additionally, bus topologies are inexpensive. The common media consists only of metal lines and connectors. Each slot of the bus slot is sufficiently inexpensive to provide that the incremental expense for providing unused slots is not prohibitive.

However there are certain practical limitations to the use of bus topologies. For example, the capacitive loading on a bus due to the attached modules greatly increases the propagation delay. This directly affects the data transfer rate in most types of data transfer protocols, for example synchronous protocols in which data transfers are centrally clocked, and in compelled asynchronous protocols which require a handshake on every data transfer. The only data transfer type which is not impacted by the bus round trip delayed caused by capacitive loading is uncompelled source synchronous bus transfers in which a long burst transfer is clocked by the sender. In such a transfer the data transfer rate is only limited by skews between bits of data and strobe.

The capacitive loading also decreases the impedance of a bus line to a very low value, i.e., approximately 20 ohms. Since a bus driver on the bus sees half the bus impedance, i.e., 10 ohms, high currents are required to drive the bus at full speed. For example, a three volt swing on the bus which is typical for TTL, will require 300 milliamps (3 volts divided by 10 ohms) to drive the bus on the first transition with proper termination. Since most bus drivers are rated only at 50 to 100 milliamps, the bus is typically under terminated and dependent on reflections to build up the signal to the final level. The reflections take one or more bus round trip delays to settle resulting in a settling time delay that is a significant portion of the transfer cycle time for a bus.

The settling time penalty can be avoided by driving the bus properly with full termination. This can be done by increasing the drive current, which unfortunately significantly increases the power and noise in the system. Also, higher current bus drivers have larger output capacitance which further reduces bus impedance. Alternately, the settling time penalty can be avoided by reducing the voltage swing. For example, the bus can be implemented using Backpane Transceiver Logic (BTL) which uses lower capacitance transceivers to reduce bus loading and uses lower signal levels to reduce the required amount of drive current to an acceptable level (i.e., 50 to 100 mA) while still driving the bus under full loading on the first transition (without reflections). Eliminating the settling time of the bus significantly improves the data transfer rate on state-of-the-art buses. Typically this improvement is 50%.

The high current required for driving the bus not only take a lot of power, but also limit the number of transceivers that can be incorporated in a single integrated circuit due to the power dissipation limits of the integrated circuit package. Typically, each integrated circuit is limited to eight to ten transceivers. Consequently, wide data/address fields and the associated synchronization signal require multiple integrated circuits for transceivers. For example, five to six integrated circuits containing transceivers may be necessary for a 32 bit bus which includes control bits and a clock. Dfferences in propagation delay (skew) between transceivers in different chips due to process, temperature and supply voltage variations require that a synchronization signal be delayed by the amount of the skew in order to guarantee that data sent across the bus is valid before a synchronization pulse arrives at the bus receiver. This delay is a significant factor limiting the maximum data rate on buses.

SUMMARY OF THE INVENTION

In accordance with the preferred embodiment of the present invention, a bus backplane is presented. The bus backplane provides a physical layer level interconnection between a plurality of modules. The bus backplane includes a plurality of bus lines incorporated within one or more integrated circuits. Each integrated circuit which includes at least one bus line is also herein referred to as a bus chip.

Incorporated on the bus chips with the bus lines are also bus drivers and bus receivers for the bus lines. These bus drivers and bus receivers provide point-to-point link between the bus lines and the plurality of modules. Each point-to-point link between a bus line and a module may include two separate point-to-point link lines. one for a bus driver and one for a bus receiver. Alternately each point-to-point links between a bus line and a module may be tri-level, including only a single point-to-point link line, that is, a signal transmitted between a module and a bus driver or bus receiver on the single point-to-point link line is at one of three levels. In a tri-level system, a module's transmit latch and receive latch as well as a bus driver and a bus receiver are all connected to a single point-to-point link line. However, the bus driver responds only to the data on the output of the transmit latch, and the receive latch responds only to data from the bus receiver.

In the preferred embodiments of the present invention, each bus chip includes only one or two bus lines. The bus chips are arranged on cards stacked in a first direction. The modules may be arranged arround the stack of cards in a variety of orientations. For example, the modules may be arranged around the stack of cards in a star formation, each module being oriented in a plane which is parallel to the first direction and perpendicular to each card in the stack of cards. Alternately, the modules may be arranged in two stacks on two sides of the stack of cards, each module being oriented in a plane which is parallel to the first direction and perpendicular to each card in the stack of cards.

The presnt invention has several advantages over the prior art. For example, each bus line is reduced to a node inside an integrated circuit. The bus line thus has a capacitance that is two orders of magnitude less than the capacitance of a conventional bus. This reduces the power required to drive the bus by two orders of magnitude.

Also, in addition to the power saving, the present invention also increases the maximum data transfer rate of the bus by a factor of at least 3 to 5 over the prior art, depending on the technology used for comparison, the type of bus protocol and the mode of transfer used. The reasons for the improved speed includes, for example, the elimination of bus settling time. Since the bus line is now reduced to a node within an integrated circuit, there is no reflections or settling times that limit bus performance. Further, the point-to-point links used by the present invention are merely an extension of links that exist between each data/address latch and transceiver in the prior art. However, point-to-point links are 3 to 5 times lesser propagation delay than a loaded bus as describd in the prior art. Additionally, due to low capacitive loading to the bus node inside the bus-chip, the propagation delay through the bus chip from bus driver input to bus receiver output is very small. In fact, for a given technology (TTL, CMOS, ECL etc) the bus chip can have a delay that is considerably less than that of a transceiver in the prior art. This, in combination with the lower delays in the point-to-point links to modules significantly reduces the round trip delay of the bus inclusive of the bus driver and bus receiver delays. Consequently, the latency dependent bus transfer rates—which includes all types of bus transfers except source synchronous uncompelled burst transfers used in some asynchronous buses—and bus arbitration/access times are significantly improved.

Maximum data transfer is also increased because of small chip skews. Due to the lower requirement of driving point-to-point links, these links can be directly driven by VLSI chips that incorporate the entire data path and the sychronization signal on the same chip. This drastically reduces the skews between these lines. Also, the chip to chip skews of the bus chip can be kept small because of various advantages. For example, the low power dissipation keeps the temperature of all bus chips close to ambient. By incorporating these chips physically close together as an integral part of the backplane system their temperature can be kept substantially the same independent of the polarity of any given bit on the bus. Their supply voltage also can be substantially the same for the same reason. Due to constant loading of the bus node and the point-to-point links, the propagation delay variations that occur between the bus chips are mainly due to process variations which can be compensated for either by circuit design or by on-chip trimming of the delays during the manufacturing process. Lower skews increase the data transfer rate on skew limited transfer modes such as source synchronous uncompelled burst transfers used in some asynchronous buses.

Further, maximum data transfer is also increased because of smaller clock distribution skews. On centrally clocked (synchronous) buses, the present invention reduces the clocked distribution skew by an order of magnitude. In the prior art, a central bus clock is generated on one designated module and sent over a bus line to other boards. Due to the finite propagation delay of the bus, the clock arrives at different boards at different times. This is called the spatial skew. Additionally, the skews between bus receivers in different modules connected to the clock line also add to the clock distribution skew. The worst case value of these skews plus other delay components determine the maximum data rate or clock frequency. In the present invention, the central clock, independent of its location on the bus, first arrives at the bus node inside the bus chip and then gets distributed from there to all other modules through identical bus receivers on the same chip. These bus receivers have very little skew between them. Furthermore, the length of the point-to point links from the chip to the modules can be made substantially the same by layout design results in simultaneous arrival of clock pulses to all modules with minimum skew between them. In addition, there is no need to restrict the position of the module with the central clock to a particular slot on the bus.

Finally, maximum data transfer is also increased because the present invention eliminates wire-OR glitch delays. The present invention eliminates wire-OR glitches caused by the transmission line nature of the bus lines in the prior art. This not only eliminates the need for glitch filters on these lines but also eliminates the delays introduced by such glitch filters. Such delays are equal to the bus round trip delay plus the tolerance of the circuit. The elimination of the need for glitch filters in the present invention reduces the arbitration times on both synchronous and asynchronous buses that use distributed arbitration protocols and increases data transfer rates on asynchronous multi-slave transfers that use Wire-OR handshake lines.

The present invention also has the advantage that burst rates are limited only by current technology. Due to low propagation delays, the pont-to-point links don't need to be terminated except for very high transfer speeds. For example, the rise and fall times of a signal across a point-to-point link measured from 20% to 80% have to get small than the 2 times propagation delay (approximately 1.7 nanoseconds for a one foot long backplane) before transmission line effects become significant. Even then, point-to point links can be series terminated at the source to avoid reflections. Series termination, which can be used only on point-to-point links, has the advantage that it does not require D.C. power. With a fully terminated link the data transfer can occur at very high rates that are only limited by the technology used for the bus drivers and bus receivers.

The present invention also has the advantage of freeing up board space on the plug-in modules as well as providing power savings. With no high powered bus transceivers required on plug-in modules, there is more board space and power available for incorporating additional functionality.

Further, the present invention is independent of technology and bus protocol. Thus, existing buses can be upgraded without software changes, alowing the systems to take advantage of the higher speed.

Also, since in the present invention each bit is isolated to a bus chip module which can be shielded from adjacent boards by using a ground plane, the cross talk is greatly reduced. In the prior art, however, due to long parallel runs of the bus lines, cross talk is a severe problem requiring special attention.

Additionally, in the present invention bus performance is independent of bus load distribution. In the prior art, uneven distribution of modules along the length of a partially populated backplane causes discontinuities in the bus impedance resulting in reflections that need to be accommodated, usually at the expense of performance. Certain worst case distributions can cause intermittent failure that are hard to predict or design around. In the present invention the bus loading is unaffected by the presence or absence of plug-in modules at any slot. Thus, the bus behaves the same way under all loading conditions and performances is not compromised to accommodate all loadiing configurations.

Further, in the present invention there is no restriction on spacing between bus plug-in modules. In the prior art closer spacing of modules reduces bus impedance. In the present invention this is not an issue because the spacing between modules has no bearing on bus loading. In fact, smaller spacings reduce the length of traces to the bus chip improving performance and makes the backplane more compact.

Also, the present invention provides for greater mechanical and electrical flexibility over the prior art. Bus connectors can be mounted on all sides of bus chip module boards. This allows for single board computers to be built as a module on the bus, but without a bus backplane for low entry cost. A backplane may be added later with a required number of slots by simply plugging in one of the backplane slots to the mother board. The mechanical flexibility of the bus chip architecture of the present invention allows for many configurations. Also, since the plug-in module to backplane connections is made up of point-to-point links, it is easy to extend the interconnection by using extender cards or flexible cabling without the need for active repeaters. The impedance of the P.C. board traces on the bus chip is approximately 100 ohms. This is close to the impedance of most cables, thus providing a good impedance match. In the prior art, the extension acts like a stup which severely affects the bus performance unless active devices are used to isolate the stub close to the main bus. With the present invention, the only limitation to the length of the extension is the added delay. For very useful distances of a few inches to a couple of feet, the reduction in the maximum data transfer rate is small compared to the flexibility of extending the bus to another chassis.

A backplane designed according to the prior art requires expensive multi-layer (typically 5 to 8 layers) printed circuit board technology with plated through holes. The bus chip modules according to the present invention can be implemented in low cost two layer surface mount technology with one layer being just a ground plane and without the requirement of plated through holes. Due to scalability of this architecture at the bit level, identical bus chip modules can be used to build different types and sizes of buses which increase the volume of the modules reducing the cost of manufacturing. Backplanes can be easily repaired by simply replacing a faulty bus chip module. In the prior art backplane, any shorts or opens in the multi-layer board or damages to the plated through holes during connector insertion are not repairable and therefore, reduces the yield increasing production cost. The present invention also allows electrical performance testing at the backplane level to guarantee delays and skews. Such testing is possible because the bus drivers and bus receivers on each bus chip are independent of the plug-in modules. This also makes specifying bus standards easier and precise, increasing compatibility between boards from different vendors even at very high data rates. There is additional cost savings resulting from the removal of transceivers from the modules and savings due to reduced power requirements of the bus system.

Finally, since the modules of the present invention are isolated from the bus node by the bus chip, the architecture allows for reliable live insertion and removal. By designing the module to present the high impedance bus state on a bus driver output during insertion or removal of modules, it is possible to perform maintenance or re-configuration of the bus without turning the power off. In the prior art, live insertion and removal is inherently more difficult because of the change in bus loading during the insertion and removal.

While the present invention is particularly suited for the enhancement of performance of a physical layer implementation of a bus topology, the invention may also be used to enhance performance of other topologies such as the physical implementation of a ring topology or a circuit switched topology.

DESCRIPTION OF THE PRIOR ART

Figure 1:
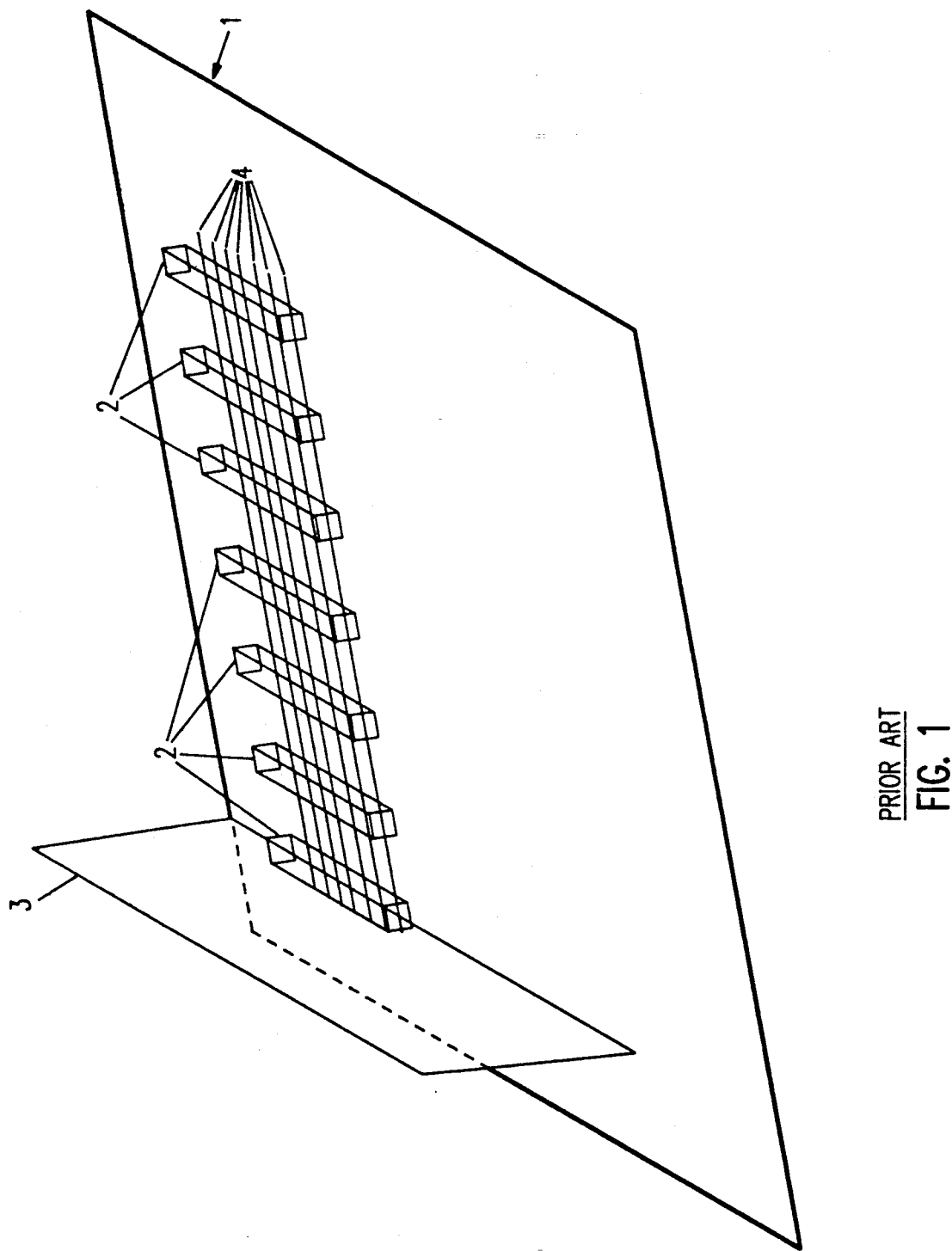
FIGS. 1 through 4 describe a prior art physical layer bus architecture.
Figure 2:
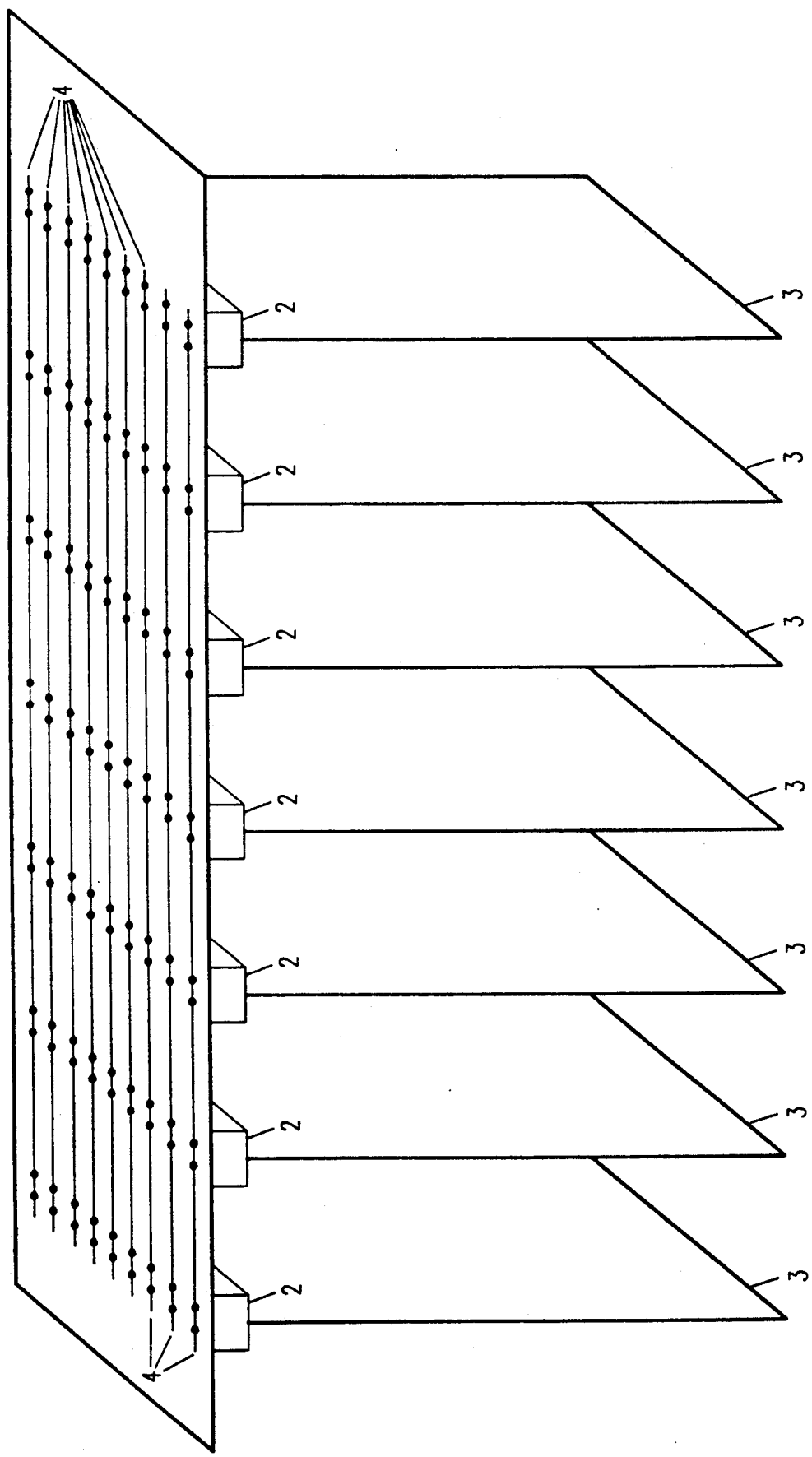
Figure 3:
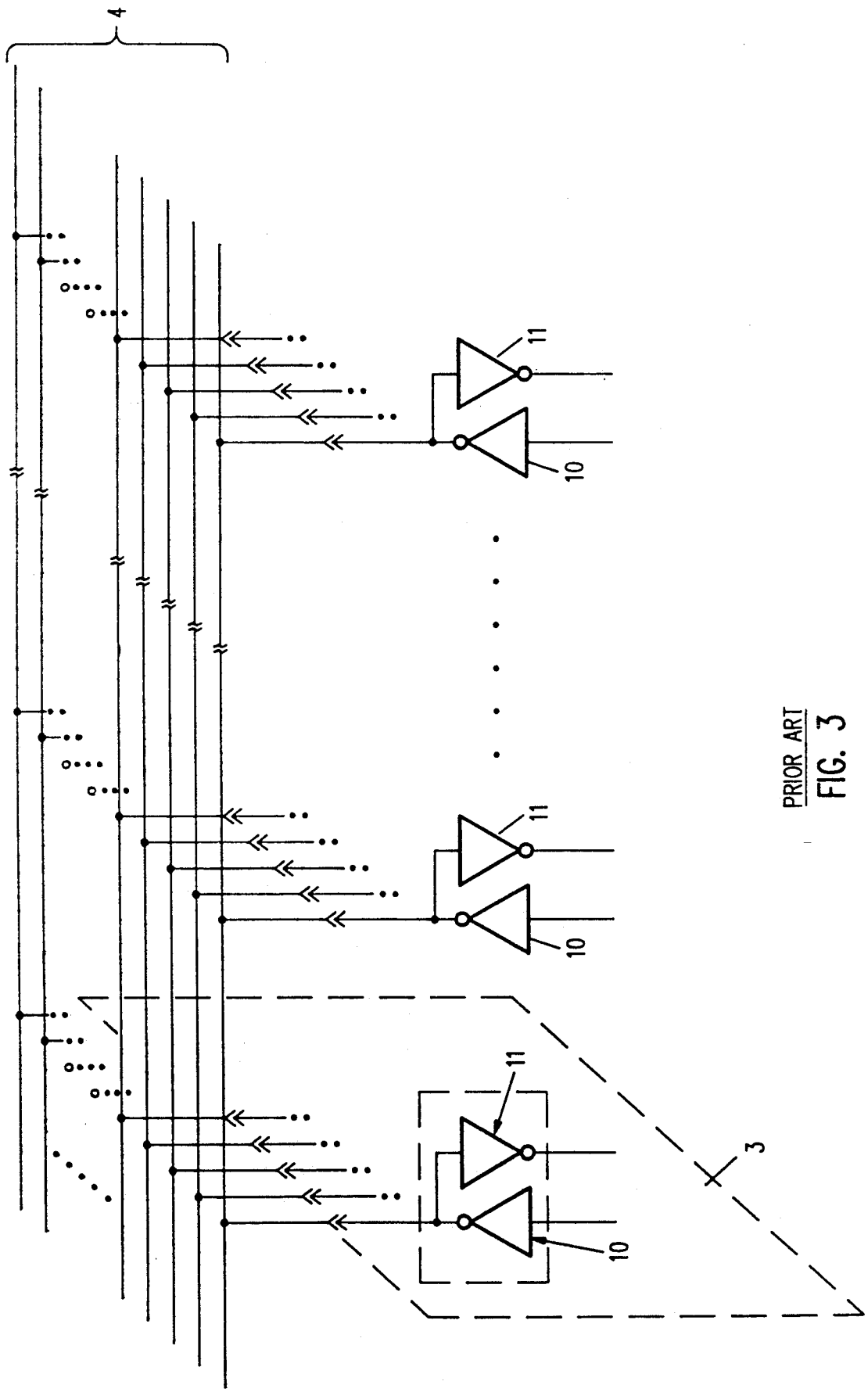

In FIGS. 1 and 2 simplified diagrams of prior art bus systems are shown. A mother board 1 houses a bus backplane. Plug-in modules 3 are connected to the bus backplane through connectors 2. Trace lines 4 serve as the physical medium of the bus. Trace lines 4 include a trace line for every data/address line of the bus as well as additional clock and/or control lines. For example a thirty-two bit bus might typically include thirty-two data/address lines, a clock line, and twenty control lines for a total of 53 lines. As shown in FIG. 3, each plug-in module 3 includes a bus driver 10 and a bus receiver 11 for each of trace lines 4 of the bus.

Figure 4:
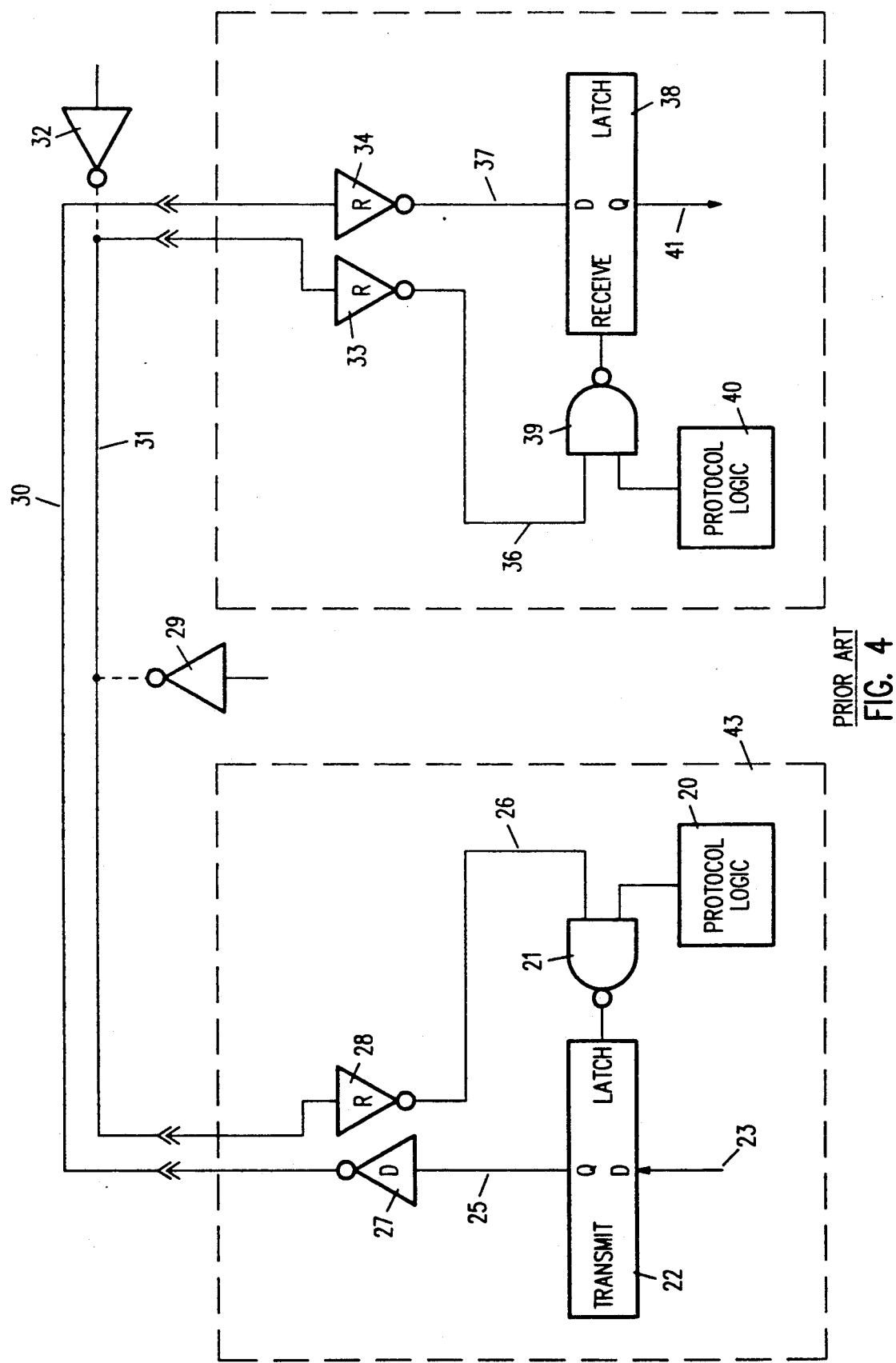

FIG. 4 shows a schematic of receive and transmit logic for a bit line 30 of a typical prior art synchronous bus. An end drive clock source 32 provides a clock signal for the system. Alternately, a center drive clock source 29 may be used. A clock signal from the clock source 29 or 32 travels to every plug-in module along a clock line 31.

Logic for driving a single bus line are shown for a plug-in module 43 and a plug-in module 44. When plug-in module 43 transmits data, data to be transmitted is placed on an input 23 of a transmit latch 22. Protocol logic 20 through a gate 21 controls forwarding of data on input 23 to an output 25 of transmit latch 22. Plug-in module 43 receives the clock signal to a line 26 through a bus receiver 28. Data is transmitted to bit line 30 on the bus backplane via a bus driver 27.

When plug-in module 44 receives data, data is received from bit line 30 through a bus receiver 34 to an input 37 of a receive latch 38. Protocol logic 40 through a gate 39 controls forwarding of data to an output 41 of receive latch 38. Plug-in module 44 receives the clock signal to a line 36 through a bus receiver 33.

The maximum data transfer rate for state-of-the-art buses is liimited by several delay components. For example there is delay as a signal travels through bus driver 27 and bus receivers 28, 33 and 34 (tD,tR). There is delay while input to receive latch 38 is set-up and while data is held by receive latch 38 (ts,th). There is delay while the clock signal travels through gate 21 to output 25 of transmit latch 22 (tCO); there is delay as a signal propagates through bus bit line 30 (tB). There is delay while reflections of the signal on the bus settles (tST). There is delay caused by skew between bus driver 27 and other bus drivers on plug-in module 43 (tDsk), between bus receiver 28 and other receivers on plug-in module 43 (tRsk), between bus receiver 33 and other receivers on plug-in module 44 (tRsk), between bus receiver 34 and other bus drivers on plug-in module 44 (tRsk), between transmit latch 22 and other transmit latches on plug-in module 43 (tCOsk), between receive latch 38 and other receive latches on plug-in module 44 (tssk), between bus line 30 and other bus lines on the bus backplane (tBsk). There is also clock distribution skew (tCsk) when a centrally generated clock is used.

The peak data rate on well known state-of-the-art 32 bit standard buses such as Nubus, Multibus II or VMEbus is limited to about one transfer per 100 nanoseconds or 10 Megatransfers/second (MT/S). Of this delay 30 to 35 percent is due to the settling time resulting from the insufficient drive of the bus drivers. Sufficient drive and proper termination of the bus, using BTL for example, would improve the transfer rate to around 15 MT/S.

DESCRIPTION OF THE PREFERRED EMBODIMENT

Figure 5:
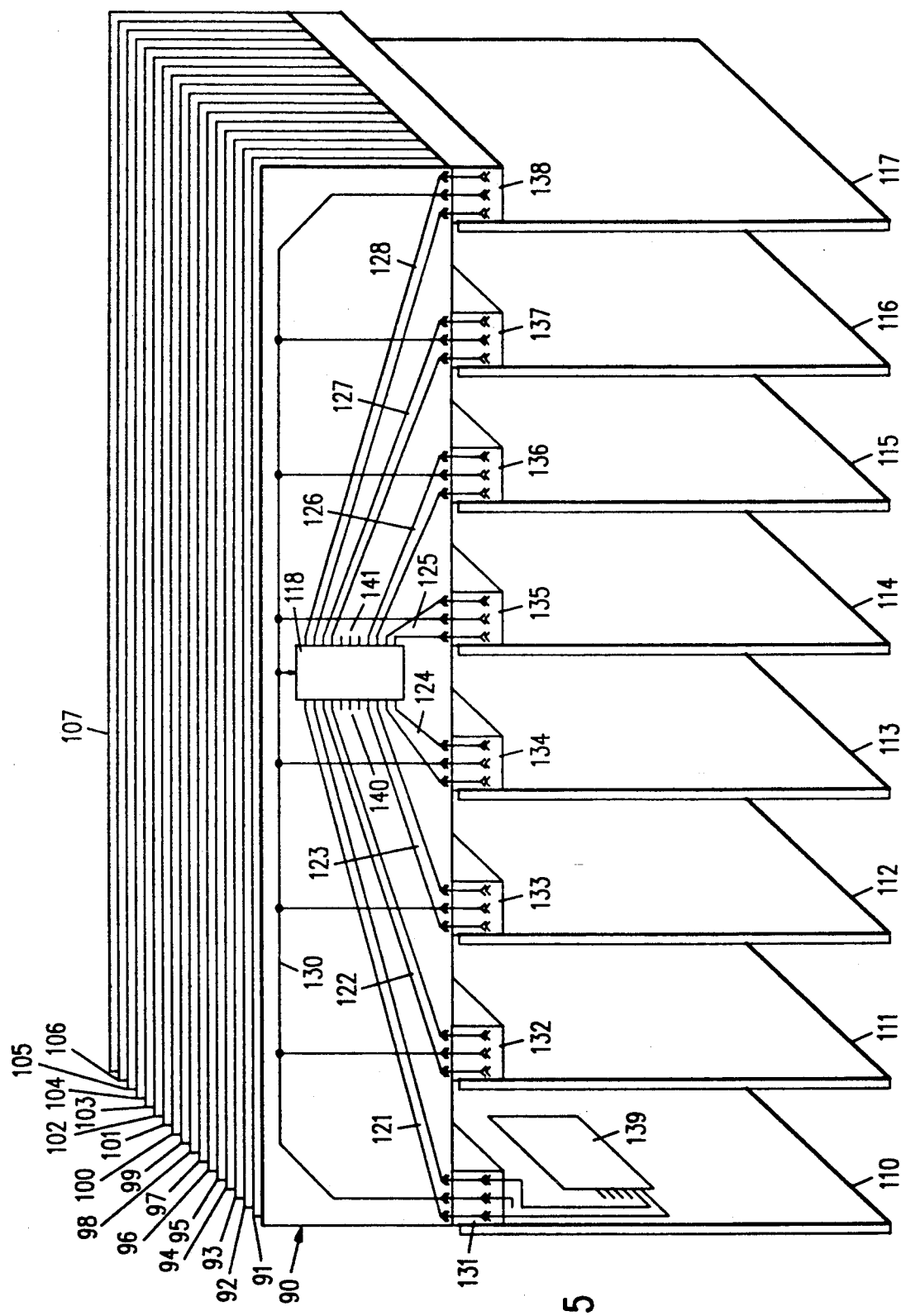
FIG. 5 shows an implementation of a bus backplane and plug-in modules in accordance with a preferred embodiment of the present invention.

In accordance with a preferred embodiment of the present invention, bus lines, along with bus drivers and bus receivers for the bus line, are placed on integrated circuits. For example, FIG. 5 shows an implementation of the present invention wherein a bus backplane consists of a plurality of cards 90 through 107. Plug in modules 110 through 117 are connected to the bus backplane through connectors 131 through 138. A bus protocol circuit on each plug-in module coordinates data transfer through the bus. For example, on plug-in module 110, a bus protocol circuit 139 is shown.

Each of cards 90 through 107 an integrated circuit, also called a bus chip, may include a bit line of the bus along with all the bus drivers and bus receivers for the bit line. For example, an integrated circuit 118 on card 90 includes one bit line of the bus and an associated bus driver and bus receiver for each of plug-in modules 110 through 117. For each plug-in module 110 through 117, integrated circuit 118 has a pair of wires, one of which is a point-to-point link for input to the bit line within integrated circuit 118 and one of which is a point-to-point link for output from the bit line within integrated circuit 118. For example, a pair of wires 121 is connected between integrated circuit 118 and plug in module 110 through connector 131. A pair of wires 122 is connected between integrated circuit 118 and plug in module 111 through connector 132. A pair of wires 123 is connected between integrated circuit 118 and plug in module 112 through connector 133. A pair of wires 124 is connected between integrated circuit 118 and plug in module 113 through connector 134. A pair of wires 125 is connected between integrated circuit 118 and plug in module 114 through connector 135. A pair of wires 126 is connected between integrated circuit 118 and plug in module 115 through connector 136. A pair of wires 127 is connected between integrated circuit 118 and plug in module 116 through connector 137. A pair of wires 128 is connected between integrated circuit 118 and plug in module 117 through connector 138.

A common line 130, which may be, for example, a ground or a power supply line is connected to integrated circuit 118 and each of plug-in modules 110 through 117 respectively through connectors 131 through 138. Lines 140 and 141 of integrated circuit 118 are miscellaneous inputs for ground, power supply, etc.

Figure 6:
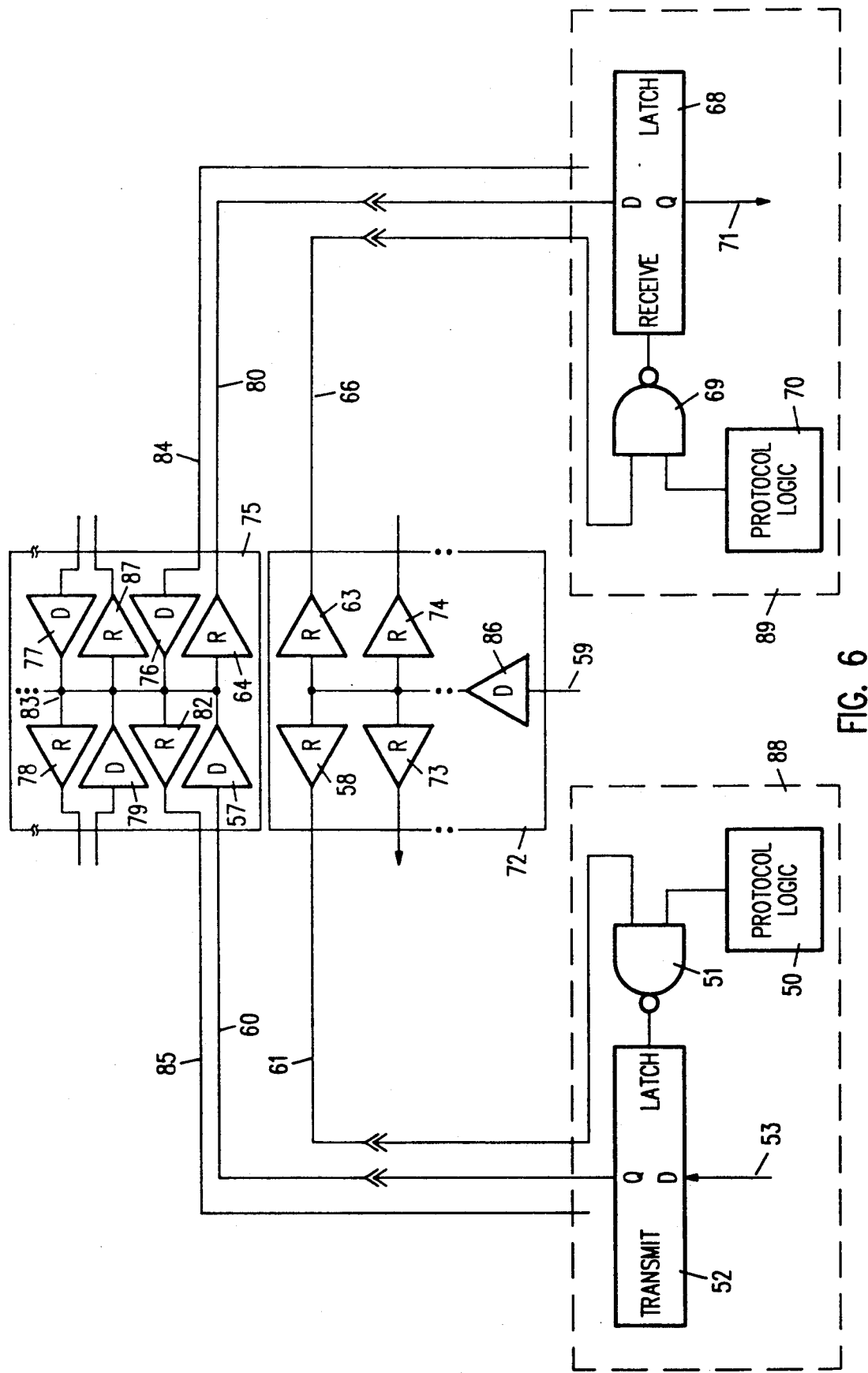
FIG. 6 shows a physical layer bus architecture in which bus receivers and bus drivers have been placed with a bus line on an integrated circuit in accordance with a preferred embodiment of the present invention.

FIG. 6 shows a simplified version of how a bus chip according to the present invention may be implemented for a synchronized (clocked) bus. A clock source is placed to an input 59 of an integrated circuit 72. Integrated circuit 72 has a bus receiver for every plug-in module. For example, in FIG. 6 are shown a bus receiver 58, a bus receiver 63 a bus receiver 73 and a bus receiver 74, each of which drive a point-to-point link between integrated circuit 72 and a plug-in module. For example, a plug-in module 88 receives a clock signal to a gate 51 through a line 61. A plug-in module 89 receives the clock signal to a gate 69 through a line 66.

A bus line 83 is contained within a bus chip 75. Bus drivers and bus receivers provide point-to-point connections between each plug-in module and bus line. For example, in FIG. 6 are shown a bus receiver 78, a bus driver 79, a bus receiver 82, a bus driver 57, a bus driver 77, a bus receiver 87, a bus driver 76 and a bus receiver 64. Each bus driver and bus receiver has a point-to-point link with a plug-in module. For example, bus driver 57 is connected to plug-in module 88 through a line 60. Bus receiver 82 is connected to plug-in module 88 through a line 85. Bus driver 76 is connected to plug-in module 89 through a line 84. Bus receiver 64 is connected to plug-in module 89 through a line 80.

When plug-in module 88 transmits data, data to be transmitted is placed on an input 53 of a transmit latch 52. Protocol logic 50 through a gate 51 controls forwarding of data on input 53 to point-to-point link line 60.

When plug-in module 89 receives data, data is received from point-to-point link line 80 to a receive latch 68. Protocol logic 70 through a gate 69 controls forwarding of data to an output 71 of receive latch 68.

Figure 7:
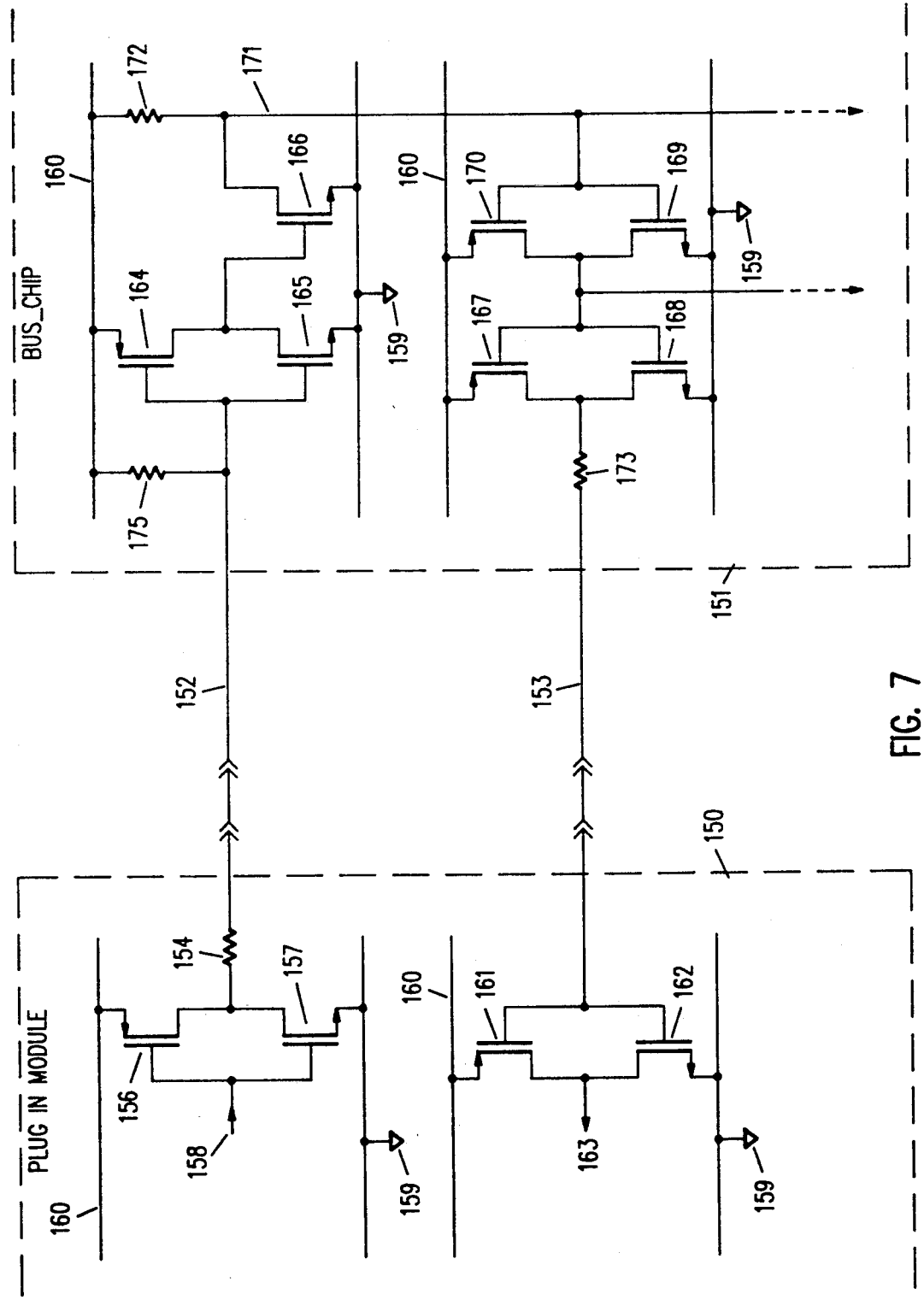
FIG. 7 shows an example of a schematic of bus drivers and bus receivers for a bus implemented in accordance with a preferred embodiment of the present invention.

FIG. 7 shows a CMOS implementation of interface circuitry between a bus chip and a plug-in module. Within a plug-in module 150, a transmit latch output stage consists of a transistor 156 and a transistor 157 connected as shown between a power line 160 and a ground line 159. Data to be transferred to a bus line 171 is placed on an input line 158 of the transmit latch output stage. For high speed transmission, a resistor 154 may be added which matches the impedance of approximately 100 ohms in point-to-point link line 152.

Also within plug-in module 150, a receive latch input stage consists of a transistor 161 and a transistor 162 connected as shown between power line 160 and ground line 159. Data received from bus line 171 through point-to-point link line 153 is placed on an output line 163 of the receive latch input stage.

Bus chip 151 includes a bus driver and a bus receiver for every plug-in module connected to bus line 171. For example, a bus driver for bus line 171 is shown to include a transistor 164, a transistor 165 and a transistor 166 connected as shown. A bus receiver for bus line 171 is shown to include a transistor 167, a transistor 168, a transistor 169 and a transistor 170 connected as shown. For high speed transmission, a resistor 173 may be added which matches the impedance of approximately 100 ohms in point-to-point link line 153. A resistor 172 serves to provide resistance between bus line 171 and power line 160. A resistor 175, for example 100 kilo ohms, serves to place the bus driver in a high impedance state when no module is attached at point-to-point link line 152.

Figure 8:
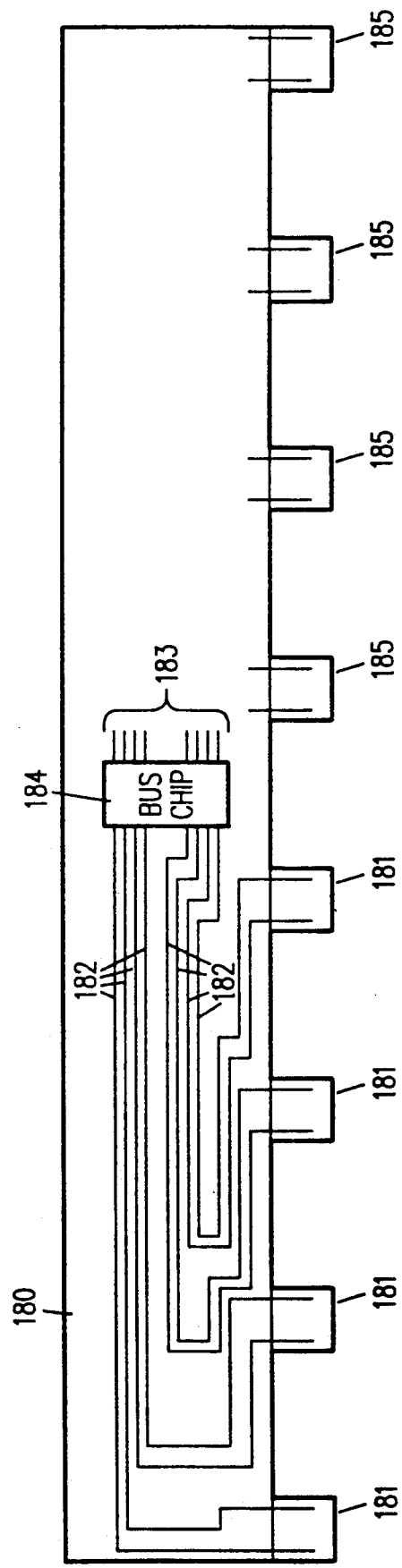
FIG. 8 shows an example of wiring on a bus backplane in order to assure a wiring between a bus chip and each module is equidistance in accordance with a preferred embodiment of the present invention.

FIG. 8 shows how it is possible to equalize the delay between a bus chip and each plug-in module. This may be done by equalizing the length of the point-to-point link line between the bus chip and each plug-in module. For example, lines 182 on a card 180 connect a bus chip 183 to connectors 181. Lines 182 are laid so as to be equal length. Similarly lines 183 can be laid between bus chip 184 and connectors 185 in a pattern which mirrors the layout of lines 182.

Figure 9:
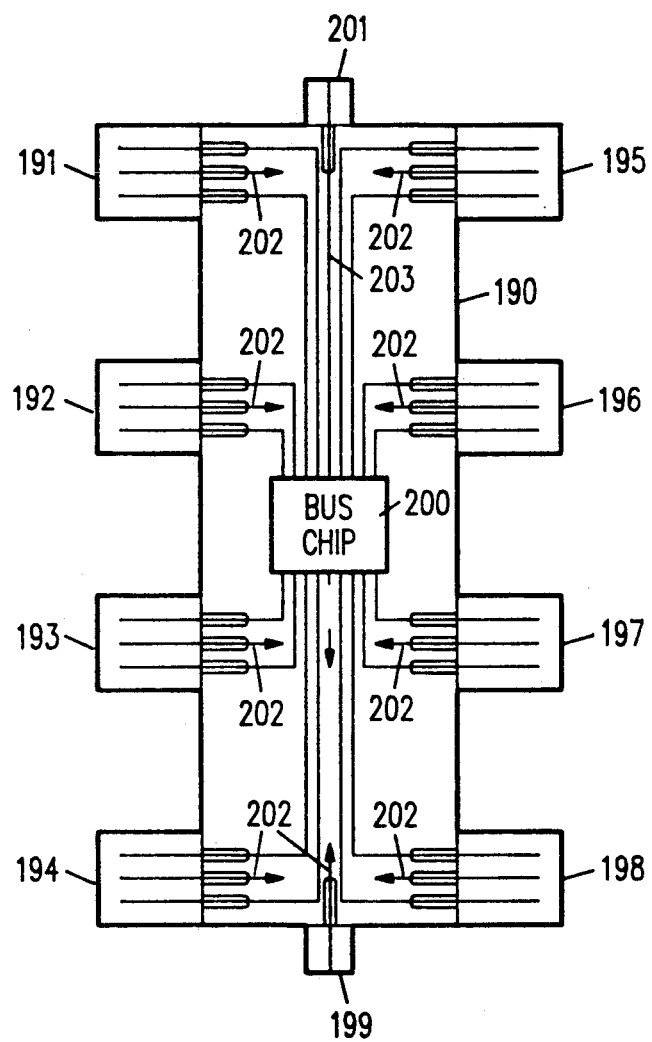
FIG. 9 shows an alternate implementation of a bus backplane and plug-in modules in accordance with a preferred embodiment of the present invention.

FIG. 9 shows a top view of a configuration for a bus backplane. Connectors 191 through 198 are shown placed on two sides of the bus backplane. A plurality of cards are stacked between the connectors 191 through 198. In FIG. 9, only a top card 190 is shown. Card 190 includes a bus chip 200 which includes two lines dedicated to each connector 191 through 198. For each connector the two lines may include a transmit line and a receive line when bus chip contains only a single bus line. When bus chip 200 contains two bus lines, then each line passes signals for both transmission and reception. In this case, bus chip 200 implements tri-level logic as will be more fully described below. A ground line 202 is connected to the bus backplane through a connector 199. A power line 203 is connected to the bus backplane through a connector 201.

Figure 10:
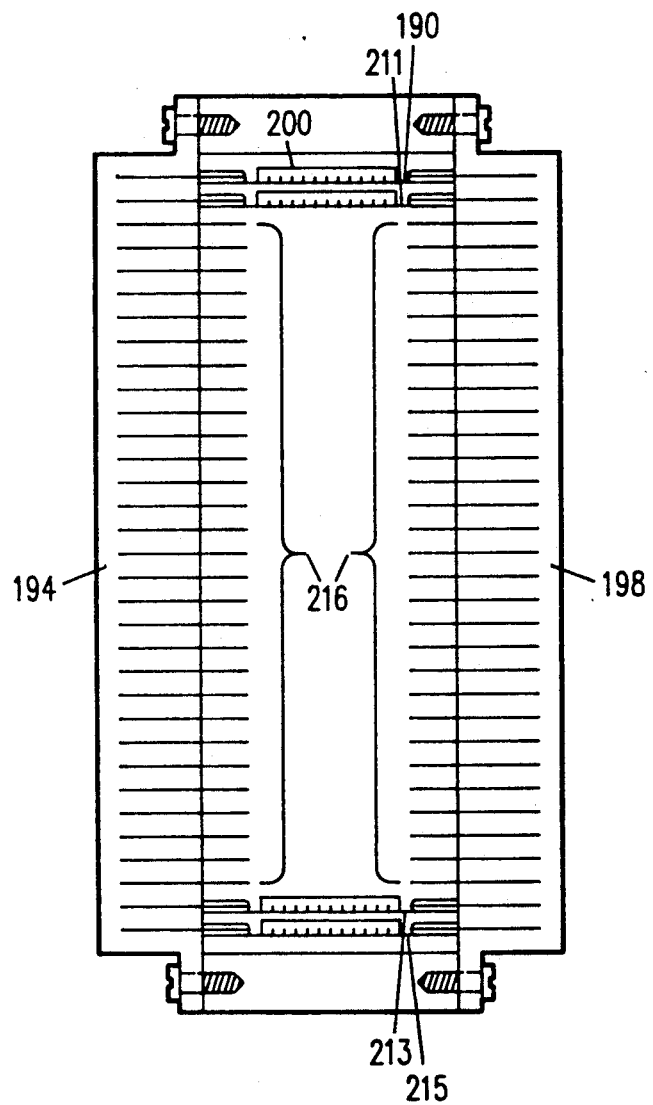
FIGS. 10 thorugh 13 show implementation details of the bus backplane of FIG. 9 in accordance with a preferred embodiment of the present invention.

FIG. 10 shows a side view of the bus back plane shown in FIG. 9. When completely assembled, a card is in every one of slots 216 of the bus backplane. Most of the cards will contain a bus chip; however, some cards may not have a bus chip because all bus connector pins connected to that card may be assigned to ground or VCC. This is usually the case for a few cards on the top and the bottom of a stack of cards. In FIG. 10 only bus card 190, a bus card 211, a bus card 213 and a bus card 215 are shown. As discussed above, each bus chip includes one or two bus lines.

Figure 11:
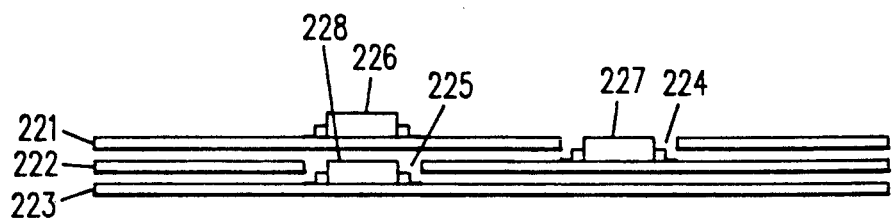
Figure 12:
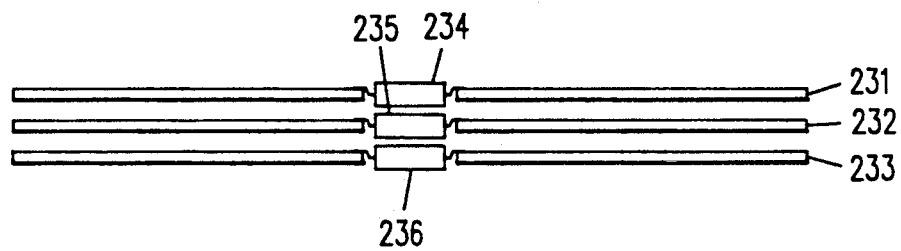
Figure 13:
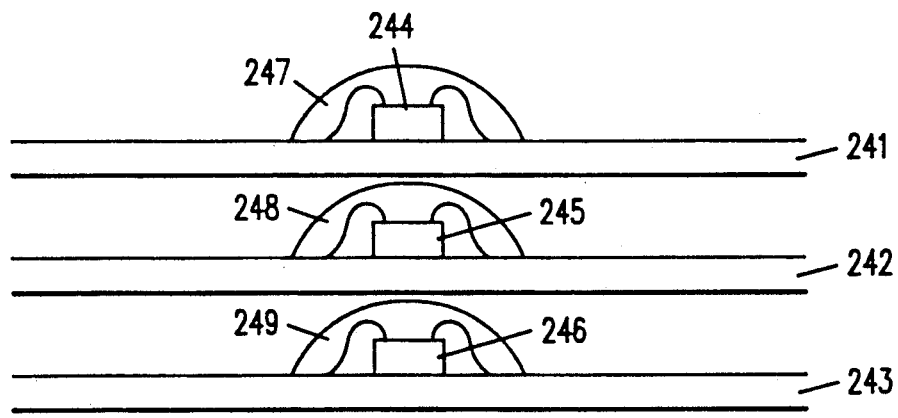

As seen in FIG. 10, the spacing between pins on the bus connector needs to be sufficient to allow for the height of the bus chip. However, typical spacings between pins on a bus connector is 100 mils. Therefore it is necessary to make the bus chip module as thin as possible. FIGS. 11 through 13 show ways that the height of the backplane may be shortened further.

For example, as shown in FIG. 11, placement of bus chips 226 through 228 respectively on cards 221 through 223 have been staggered allowing a hole 224 in card 221 and a hole 225 in card 222 to be cut.

Alternately, bus chips may be mounted within a hole in a card. As shown in FIG. 12, a bus chip 234 is mounted in a hole in a card 231, a bus chip 235 is mounted in a hole in a card 232 and a bus chip 236 is mounted in a hole in a card 233.

Another solution is to mount bus chip dies directly on cards using an epoxy covering. As shown in FIG. 13, a bus chip die 244 has been mounted on a card 241 using an epoxy covering 247, a bus chip die 245 has been mounted on a card 242 using an epoxy covering 248 and a bus chip die 246 has been mounted on a card 243 using an epoxy covering 249.

Figure 14:
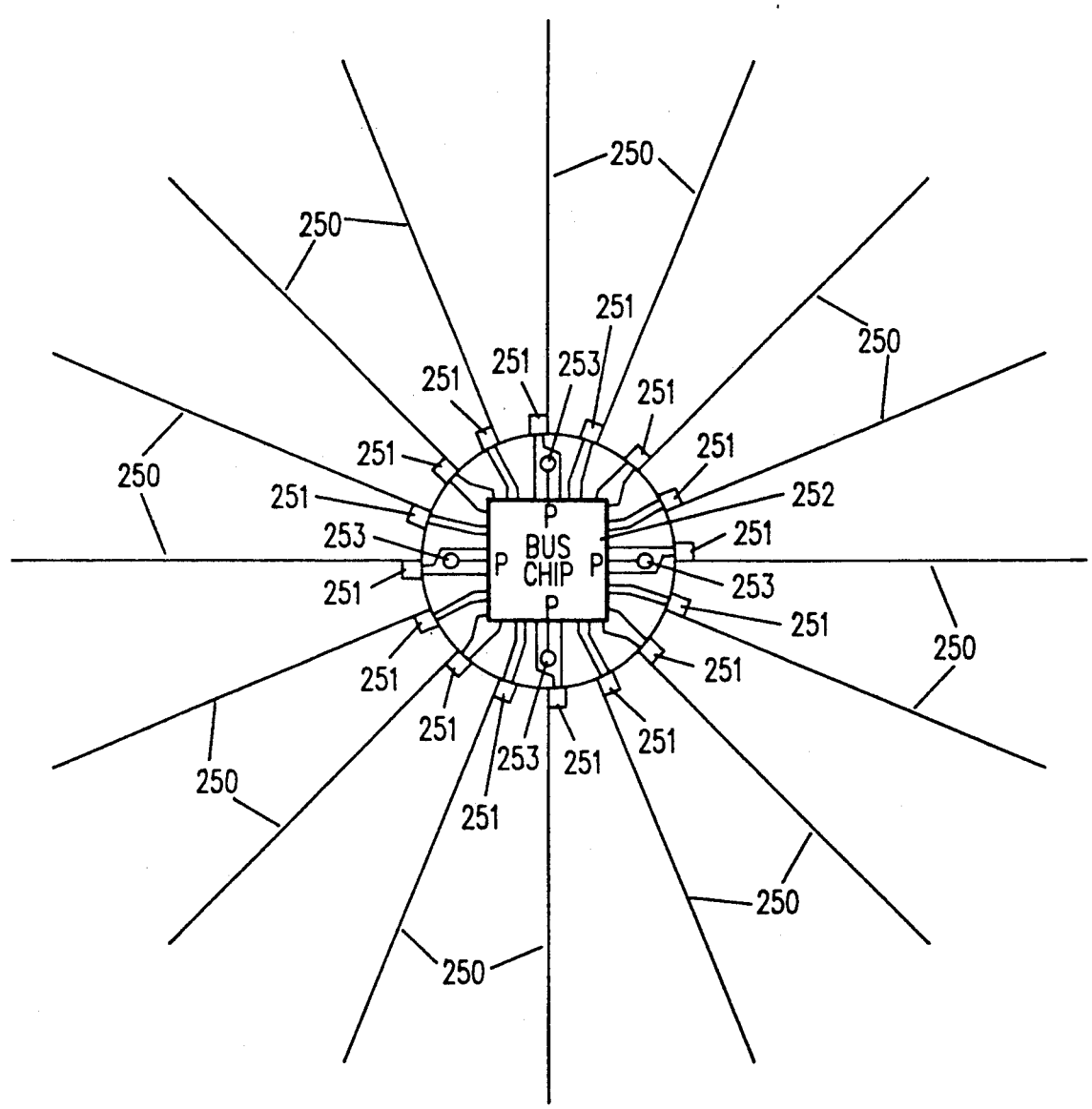
FIG. 14 shows another alternate implementation of a bus backplane and plug-in modules in accordance with a preferred embodiment of the present invention.

FIG. 14 shows a bus backplane configuration in which the length of point-to-point link lines between bus chips and plug-in modules are minimized. As shown, plug-in modules 250 are arranged in a star formation around the bus backplane. A bus chip 252 is shown as the top level of the bus backplane. The bus chips are connected to plug-in modules 250 through connectors 251. Power posts 253, running the length of the bus backplane supply power to the bus backplane. Each bus chip, may include a single bus line with standard two level logic, or may contain two bus lines, in which case tri-level logic would be used.

Figure 15:
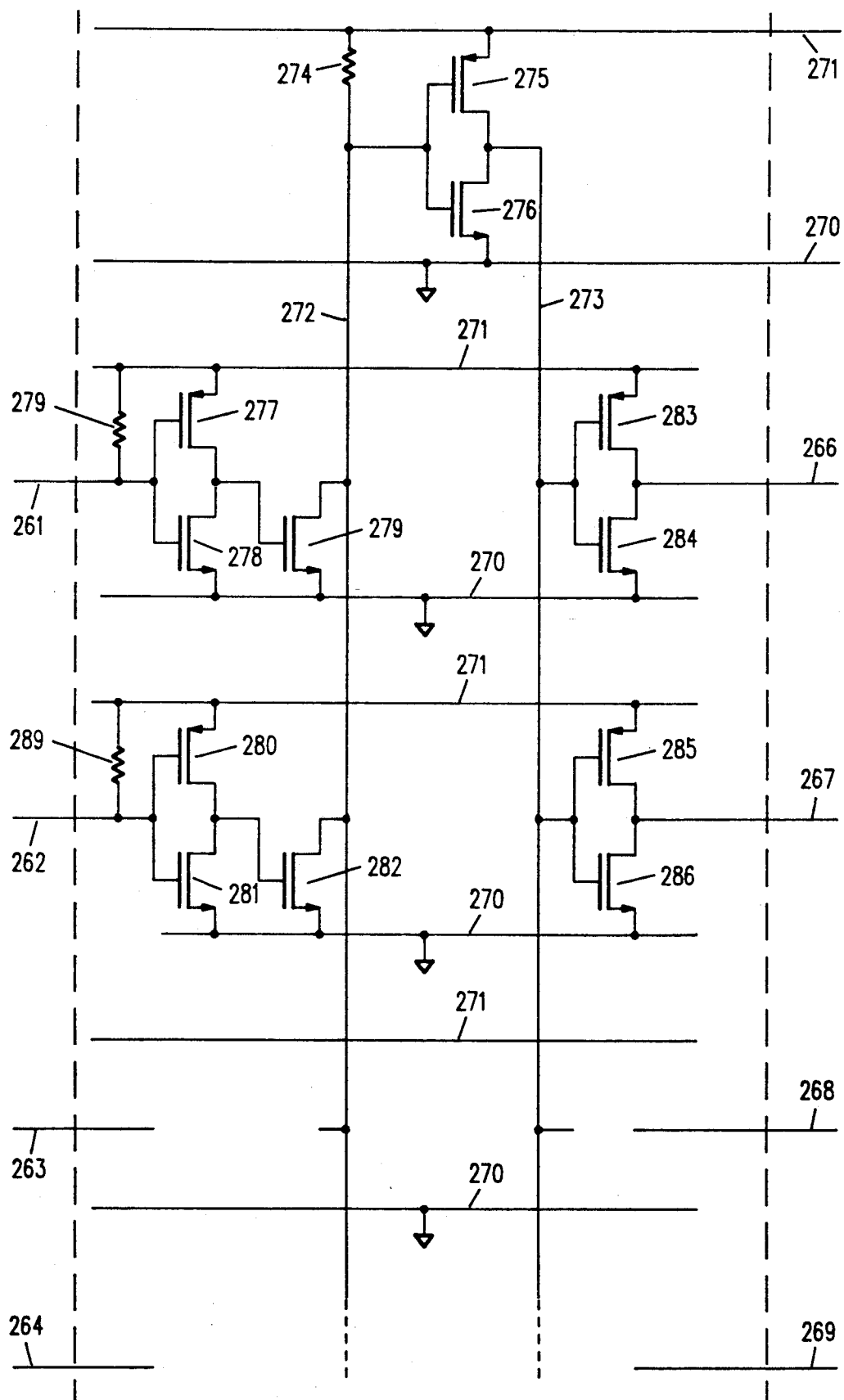
FIG. 15 shows an example of a schematic of a bus architecture in which bus receivers and bus drivers have been placed with a bus line on an integrated circuit which uses CMOS technology in accordance with a preferred embodiment of the present invention.

FIG. 15 shows a CMOS implementation of a bus chip which contains a single bus line 272. A resistor 274 serves to provide resistance between bus line 272 and a power line 271. A bus driver input line 261 is connected to a first plug-in module. A bus driver input line 262 is connected to a second plug-in module. A bus driver input line 263 is connected to a third plug-in module. A bus driver input line 264 is connected to a fourth plug-in module. Bus driver circuitry separates bus line 272 from bus driver input lines 261 through 264. For example, bus driver circuitry consisting of a transistor 277, a transistor 278 and a transistor 278 is shown connected to bus driver input line 261. A resistor 279, for example, 100 kilo ohms, is used to place the bus driver in a high impedance state when no module is connected to bus driver input line 261. Similarly, bus driver circuitry consisting of a transistor 280, a transistor 281 and a transistor 282 is shown connected to bus driver input line 262. A resistor 289, for example, 100 kilo ohms, is used to place the bus driver in a high impedance state when no module is connected to bus driver input line 262.

A bus receiver output line 266 is connected to the first plug-in module. A bus receiver output line 267 is connected to the second plug-in module. A bus receiver output line 268 is connected to the third plug-in module. A bus receiver output line 269 is connected to the fourth plug-in module.

Bus receiver circuitry separates bus line 272 from bus receiver output lines 266 through 269. For example, circuitry consisting of a transistor 275 and a transistor 276, connected as shown between power line 271 and a ground line 270 separate a line 273 from bus line 272. Bus receiver circuitry consisting of a transistor 283 and a transistor 284 is shown connected between line 273 and bus receiver output line 266. Similarly, bus receiver circuitry consisting of a transistor 285 and a transistor 286 is shown connected between line 273 and bus receiver output line 267.

In the implementation shown by FIG. 15, an open drain wire-OR bus is used instead of a tristate bus to avoid the tristate control line that needs to be connected back to each module. A tristate bus will increase the number of point-to-point links to each module to three. Alternatively, a common tristate line can be used for the entire width of the data/address path requiring only one additional link for the set of line controlled. However, this would require interconnections between bus modules which would increase the complexity of the backplane system. The wire-or bus avoids these problems and simplifies the electro-mechanics of the backplane.

To get off the bus, a plug-in module simply outputs a high state or the high impedance state on all lines that need to be released. This allows another module to drive the bus. Tristate bus drivers are preferred in prior art busses because of the active pull up that provides high dynamic current. But, due to the very low node capacitance of the bus node on a bus-chip, this is not an issue for implementations using the present invention.

For example, a 16 module bus-chip is expected to have a capacitance of approximately 1 pF in one micron CMOS technology. This requires only a one kilo ohm pull-up resistor for a 1 nanosecond time constant. This amounts to a supply current of 5 mA typical or a DC power consumption of 25 milliwatts (mW) at a power supply voltage of 5 volts for the entire chip. The CMOS implementation shown in FIG. 15 can be used at any power supply voltage down to 3.3 volts with standard transistor threshold of 0.7 to 0.8 volts.

Non-inverting bus drivers and bus receivers are shown in the embodiment shown in FIG. 15 for two reasons. First, the use of a standard inverter before the open drain bus driver allows for the input to have a standard CMOS threshold. Second, the bus input capacitance can be minimized by using minimum size open drain inverter bus driver transistors and a single bus receiver inverter stage input connected to the bus node followed by separate bus receiver output stages for each module. However, inverting bus drivers and bus receivers could provide faster speeds in some technologies such as open collector bipolar implementations.

Figure 16:
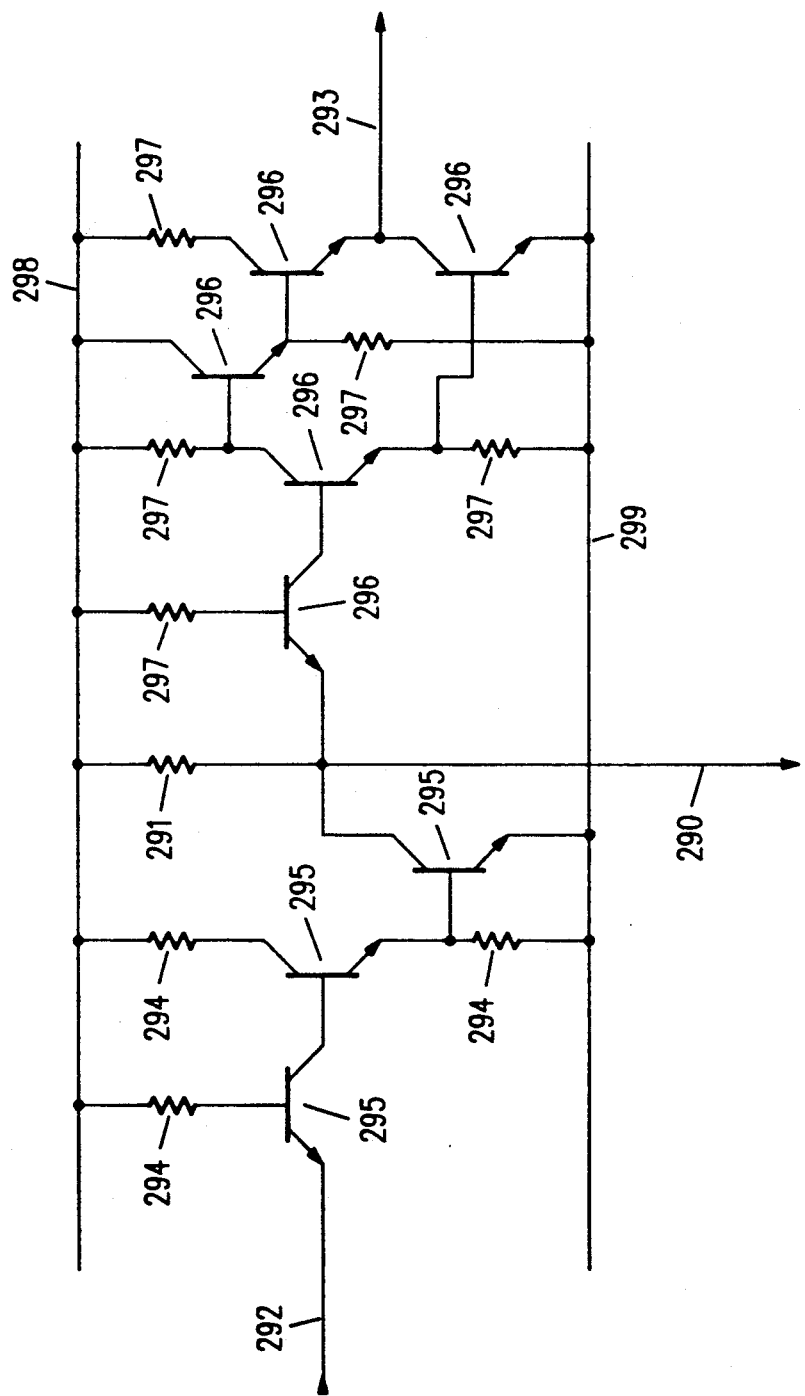
FIG. 16 shows an example of a schematic of bus receivers and bus drivers and a bus on an integrated circuit which uses TTL technology in accordance with a preferred embodiment of the present invention.

For example, FIG. 16 shows how a bus driver and a bus receiver within a bus chip may be implemented using TTL logic. A resistor 291 provides resistance between a bus line 290 and a power line 298. Bus line 290 and resistor 291 are common for all bus drivers and bus receivers within the bus chip. Bus driver circuitry connects a bus driver input 292 with bus line 290. Bus driver circuitry consists of resistors 294 and transistors 295 connected as shown between power line 298 and a ground line 299. Bus receiver circuitry connects a bus receiver output 293 with bus line 290. Bus receiver circuitry consists of resistors 297 and transistors 296 connected as shown between power line 298 and ground line 299.

Figure 17:
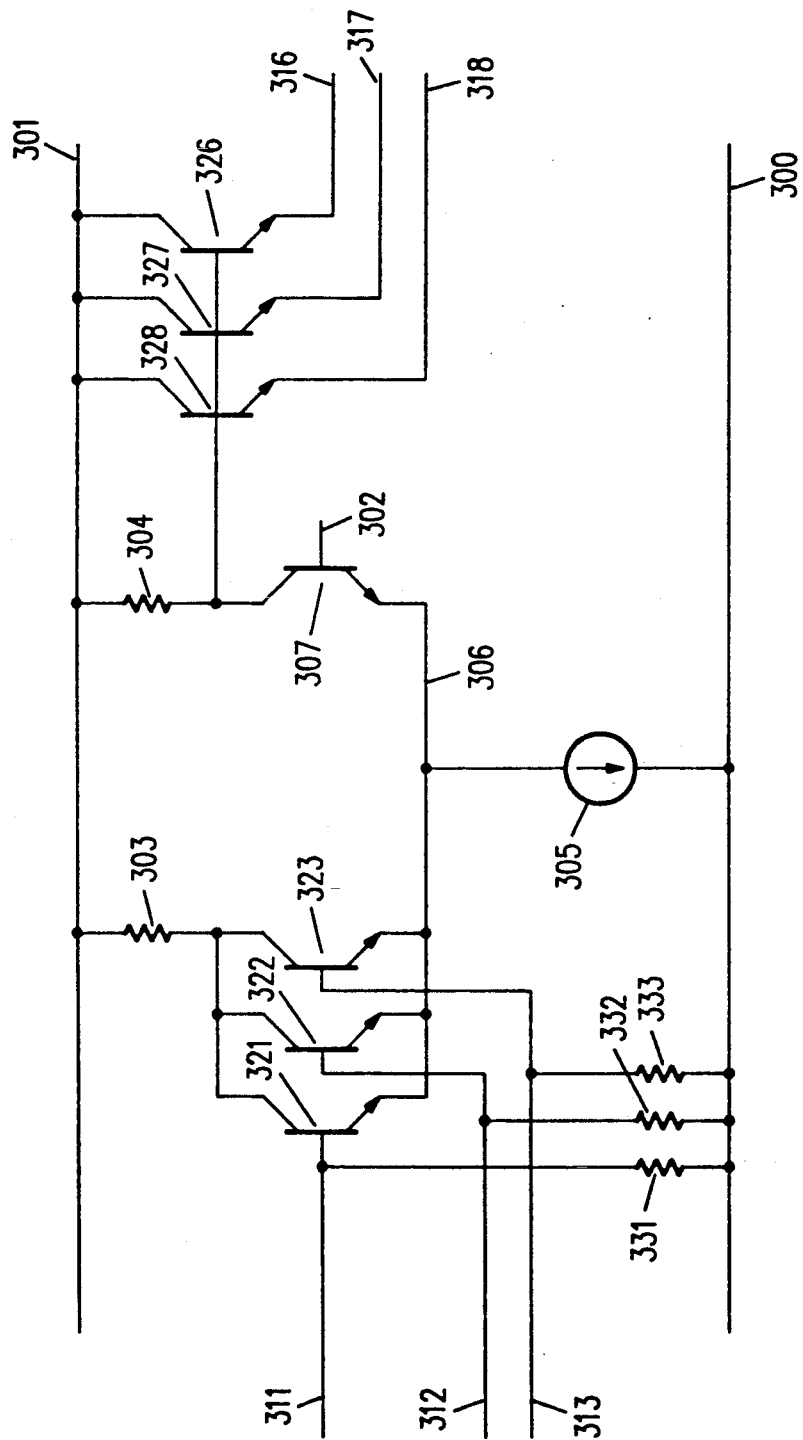
FIG. 17 shows an example of a schematic of bus receivers and bus drivers and a bus on an integrated circuit using a standard implementation of ECL logic in accordance with a preferred embodiment of the present invention.

FIG. 17 shows a standard ECL implementation of an integrated circuit. A single bus line 306 is an open emitter wire-or bus which has a high impedance state corresponding to a low on bus line 306 when all bus driver inputs are low. This is the opposite of an open collector/drain configuration where the high impedance state is a high on the bus line. Bus line 306 is connected through a current source 305 to a $V_{EE}$ voltage source at, for example, −4.5 volts. A resistor 303 common for all bus drivers on the integrated circuit is connected to a $V_{CC}$ line 301 which is typically at 0 volts. A transistor 321 and a resistor 331 serve as a bus driver for an input bus driver line 311. A transistor 322 and a resistor 332 serve as a bus driver for an input bus driver line 312. A transistor 323 and a resistor 333 serve as a bus driver for an input bus driver line 313. For each additional input bus driver lines, an additional transistor and resistor are added.

A resistor 304 and a transistor 307 are common for all bus receivers. Transistor 307 has a base biased at, for example, at a standard 100K ECL threshold of −1.3 volts. A transistor 326 serves as a bus receiver for a bus receiver output 316. A transistor 327 serves as a bus receiver for a bus receiver output 317. A transistor 328 serves as a bus receiver for a bus receiver output 318.

Figure 18:
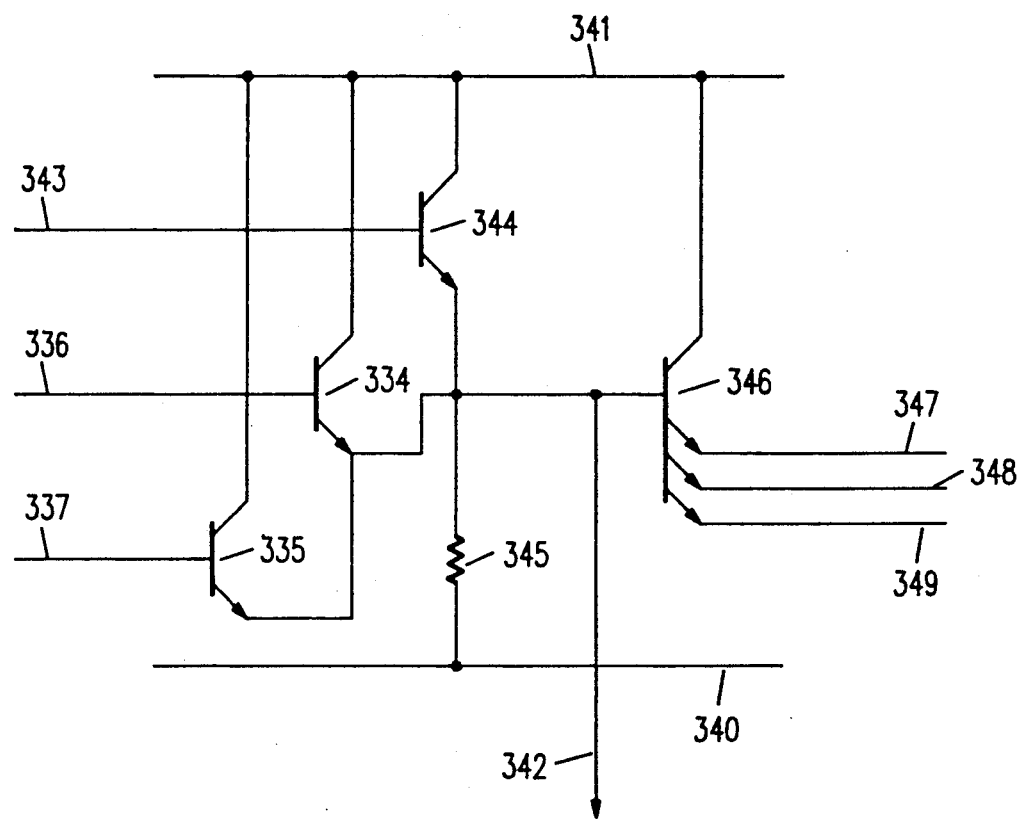
FIG.18 shows an example of a schematic of bus receivers and bus drivers and a bus on an integrated circuit using a non-standard shifted ECL logic implementation in accordance with a preferred embodiment of the present invention.

FIG. 18 shows an alternate ECL implementation of a bus driver and a bus receiver for a single bus line 342 within an integrated circuit. A $V_{CC}$ line 341 is typically at 0 volts. A $V_{EE}$ line 340 is typically at −4.5 volts. A resistor 345 is common for all bus drivers connected to single bus line 342. A bus driver input 343 is connected to a bus driver which includes a transistor 344. A bus driver input 336 is connected to a bus driver which includes a transistor 334. A bus driver input 337 is connected to a bus driver which includes a transistor 335. A transistor 346 is common for a bus receiver output 347, a bus receiver output 348 and a bus receiver output 349.

One of the disadvantages of the above-discussed dual point-to-point links to each module is that it requires two connector pins for each bus signal line. It also means that two pins need to be dedicated to each signal line on the bus protocol/interface chip in the module. This could be a severe limitation in reducing the entire bus interface to a single VLSI chip because a 32-bit bus with 60 active bus lines would require 120 lines on the bus side of the chip alone. This limitation can be overcome one of two ways. Due to the increase data transfer rate possible with the present invention the bus data/address path width could be reduced by doing multiple transfers on the bus for each word on the module side of the bus protocol chip. For example, an 8-bit bus interface running at four times the speed of prior art bus systems can maintain the same data rate as the prior art bus for a 32-bit system, but would require only one-fourth of the 120 lines discussed above. The second approach is to use a tri-level scheme to send data to and from the bus chip on a single point-to-point link line for each bus line.

Figure 19:
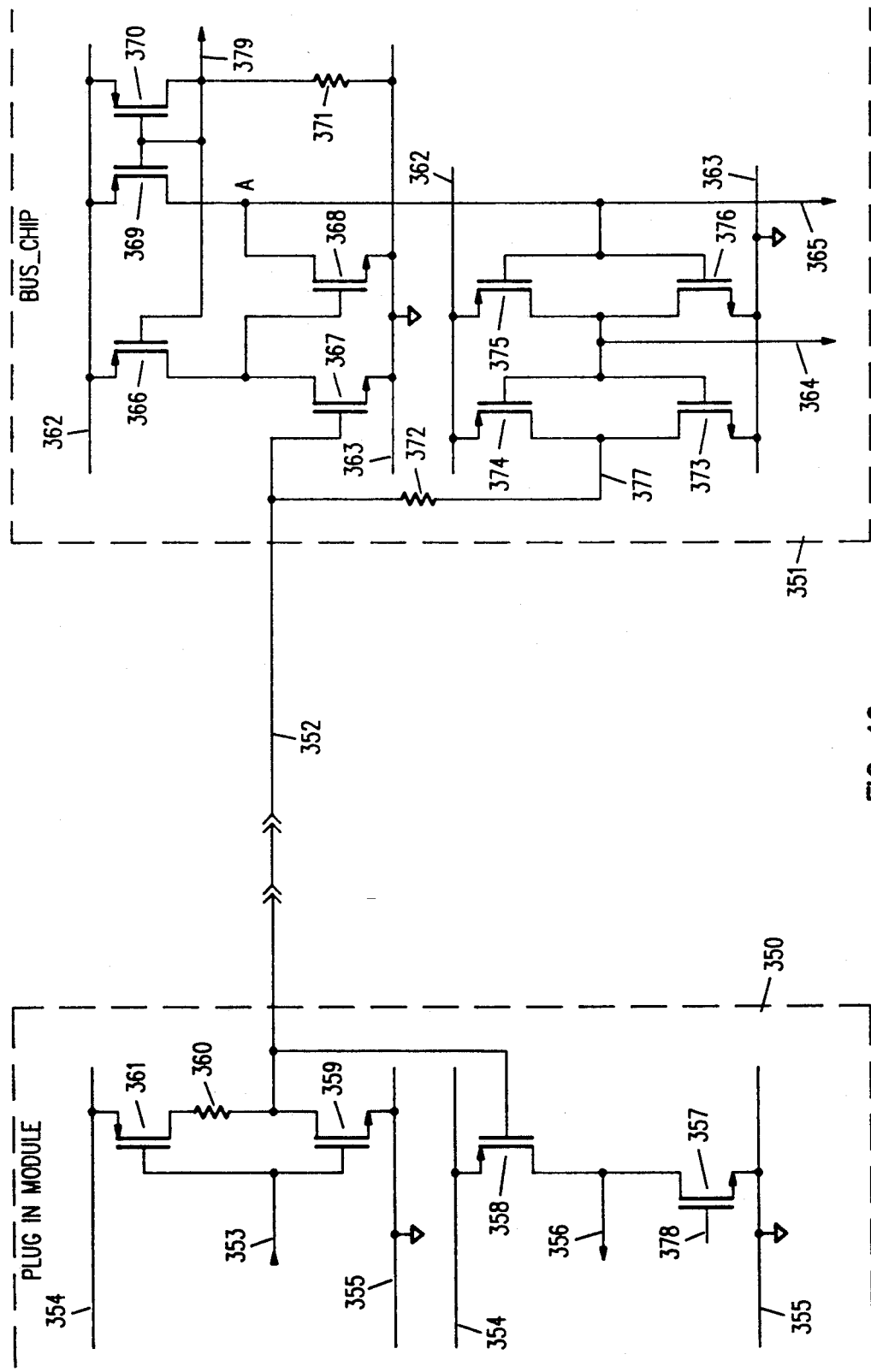
FIG. 19 shows an example of a bus architecture in which a plug-in module is connected to a bus integrated circuit using only a single line tri-level bi-directional link in accordance with a preferred embodiment of the present invention.

FIG. 19 shows a CMOS implementation of bus drivers and bus receivers in which for a bus line 365 within a bus chip 351, a single point-to-point link line 352 connects a plug-in module 350 to bus chip 351. Plug-in module 350 includes a power line 354, typically at 5 volts and a ground line 355. Within plug-in module 350, a transmit latch output stage, also called a link driver, for data placed on input 353 includes a transistor 361, a transistor 359 and a resistor 360 connected as shown. A receive latch input stage, also called a link receiver, for data received to output line 356 includes a transistor 358 and a transistor 357. Transistor 357 functions as a current source and has a voltage bias on gate 378 of transistor 357 of, for example, two volts.

Bus chip 351 includes a power line 362, typically at 5 volts, and a ground line 363, at zero volts. A bus driver includes a transistor 366, a transistor 367 and a transistor 368. A resistor 371 and a transistor 370 provide current source bias at a bias node 379 for all bus drivers on bus line 365. A transistor 369 provides pull-up current for bus line 365. Transistors 366 and 369 function as current sources with the current flow controlled by the value of resistor 371. Resistor 371 is an optional programmable current source resistor which, by controlling the current through transistors 366 and 369, controls the delay through bus chip 351. Although shown within bus chip 351, resistor 371 may be placed external to bus chip 351 to allow for the resistance value to be more easily changed. The use of resistor 371 to vary the current sources allows for compensation of bus chip delay changes due to process variations and allows for the minimization of chip to chip skews. The current source circuit consisting of transistor 366, transistor 369, transistor 370 and resistor 371 can also be designed to have a temperature trend that compensates for the temperature variation of the delay through the bus chip to minimize chip to chip skews.

A bus receiver includes a transistor 373, a transistor 374, a transistor 375 and a transistor 376 connected as shown.

The threshold voltage of all the transistors is approximately 0.75 volts. Thus the turn-on voltage for bus driver input transistor 367 is 0.75 volts. Similarly, receive latch input transistor 358 is turned on at voltages below 4.25 ($V_{CC}$—the threshold voltage of transistor 358). When input 353 is asserted high, transistor 359 is turned on and transistor 361 is turned off. This asserts point-to-point link line 352 low. The gate of transistor 358 is low which turns transistor 358 on. Also, the gate of transistor 367 is low, turning off transistor 367, which results in transistor 368 being turned on and bus line 365 being pulled low. While a bus receiver output 377 may be initially high, it remains isolated from point-to-point link line 352 by the resistor 372. Once bus line 365 is active low, this turns off transistor 376 and turns on transistor 375 pulling a node 364 high. This in turn turns on transistor 373 and turns off transistor 374 pulling bus receiver output 377 low. Thus, when the link driver is driving point-to-point link line 352 low, this state is correctly transmitted to bus line 365 and to the link receiver.

When input 353 is asserted low, transistor 359 is turned off and transistor 361 is turned on. Since resistor 360 is chosen to be equal to resistor 372, the voltage on point-to-point link line 352 is pulled up to 2.5 volts. Since the transistor 358 is on when its gate voltage is below 4.25 volts, transistor 358 remains on and output line 356 remains high. However, transistor 367 is turned on which in turn turns off transistor 368 releasing the bus. If bus line 365 is being held low by some other plug-in module, then bus receiver output 377 will remain low. Otherwise, bus line 365 be pulled high by current source 369, turning off transistor 375 and turning on transistor 376 which pulls node 364 low. This in turn turns off transistor 373 and turns on transistor 374 resulting in bus receiver output 377 being asserted high. Once bus receiver output 377 is high, point-to-point link line 352 will become high (5 volts), resulting in transistor 358 being turned off and output line 356 being asserted low. As can be seen above, when the link driver output is in the high state (2.5 Volts or 5 Volts) bus driver output (i.e., output of transistor 368) is released, but the status of bus line 365 is passed through point-to-point link line 352 to the link receiver correctly without disturbing the bus driver.

The values of resistors 360 and 372 can be chosen for the time constant needed for the speed of operation. When for example, point-to-point link line 352 is six inches, the trace capacitance will be approximately 10 picofarads and chip loading on each end could be 5 pico farads resulting in a total of 20 pico farads. In this case, if resistors 360 and 372 are each chosen to have a resistance of 200 ohms, a time constant of the connection will be 2 nano seconds, which is sufficient for up to 50 megatransfers per second. The link can be approximated to a lumped load because the propagation delay of the link (0.85 nanoseconds) is much smaller than the rise time. If the value of resistors 360 and 372 is chosen to be equal to the characteristic impedance of point-to-point link link 352, i.e., approximately 100 ohms, then the tri-level circuit shown in FIG. 19 provides perfect termination under all conditions allowing operation at extremely high data rates when point-to-point link link 352 behaves like a transmission line.

It may not be desirable to include resistor 360 in plug-in module 350 because process variations can result in the value of resistor 360 variation as much as 20% relative to the value of resistor 372. Such a variation can change the middle voltage of 2.5 volts by as much as 0.5 volts, thus reducing noise margins slightly.

Figure 20:
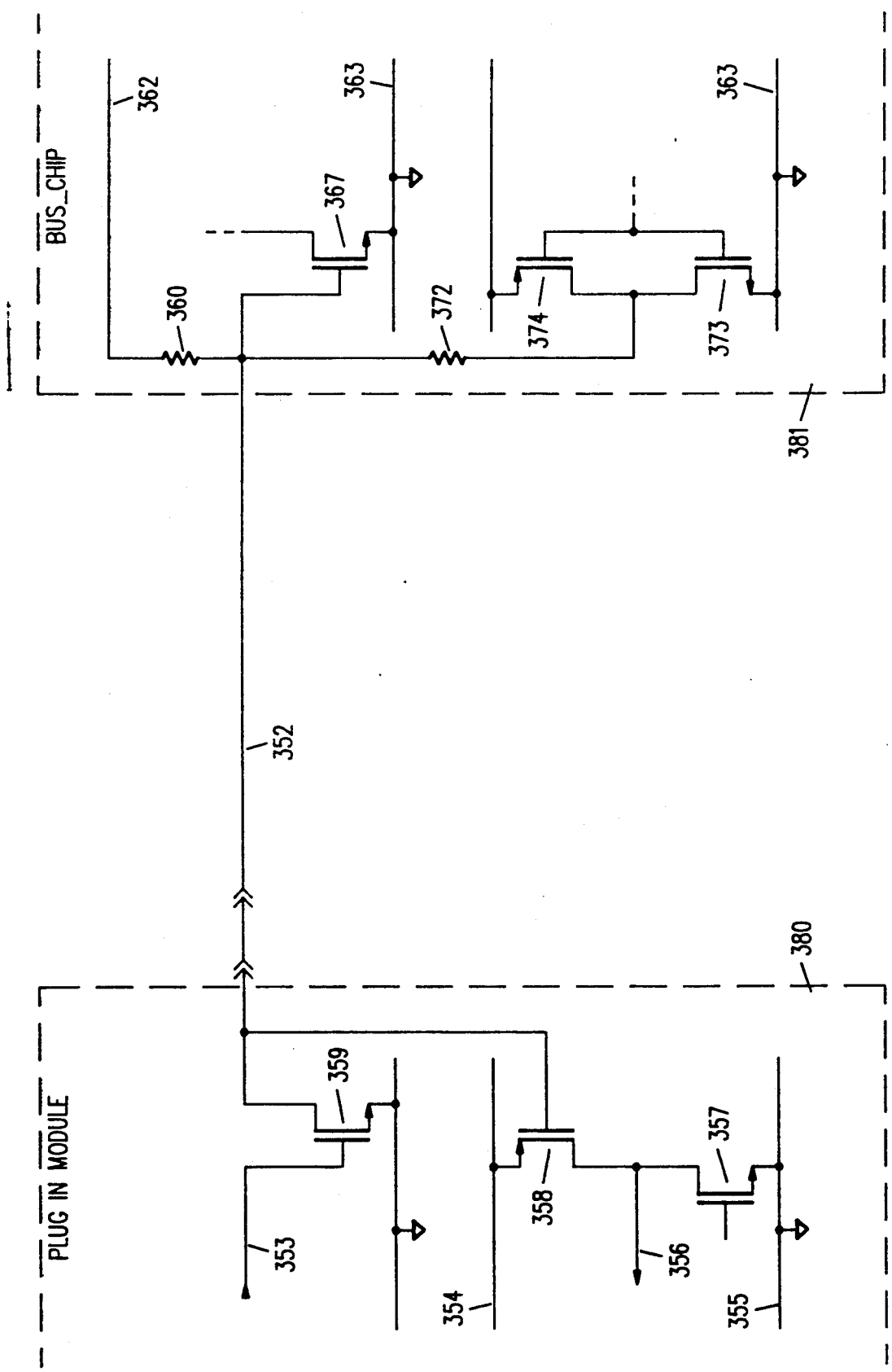
FIG. 20 shows an example of an alternate bus architecture implemented in CMOS in which a plug-in module is connected to a bus integrated circuit using only a single line tri-level bi-directional link in accordance with a preferred embodiment of the present invention.

FIG. 20 shows an alternate embodiment. A plug-in module 380 varies from plug-in module 350 only in the removal of transistor 361 and resistor 360. A bus chip 381 varies from bus chip 351 only in the placement of resistor 360 between point-to-point link line 352 and power line 362. In this way resistor 372 and resistor 360 do not vary from each other based on process variations. However, the result is an open drain transmit latch which has to sink twice the current to pull down the link under some conditions as compared to the design shown in FIG. 19. One further advantage of this embodiment over that shown in FIG. 19 is that when there is no module connected to point-to-point link line 352, power line 360 through resistor 360 pulls the the gate of transistor 367 high, placing the output of the the bus driver in a high impedance state.

A tri-level circuit can be implemented in other technologies. For example, it is possible to design a tri-level bus chip using a combination of ECL and TTL technology, that can directly interface to a standard TTL or CMOS tri-state bus drivers and bus receivers used as output/input stages of the latch in the plug-in module. This would allow operation with existing plug-in modules.

Figure 21:
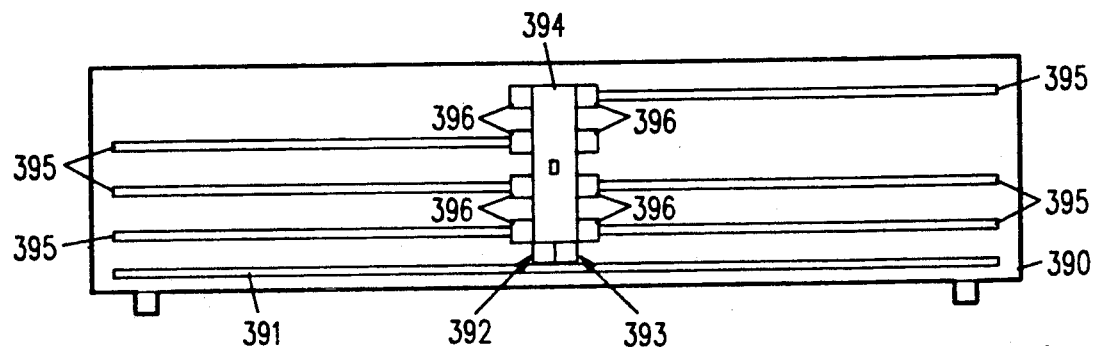
FIGS. 21 through 24 give block diagram examples of configurations using detachable bus backplanes in accordance with preferred embodiments of the present invention.

FIGS. 21 through 24 show alternate configurations of microcomputers using a bus-on-chip backplane. In FIG. 21, a mother board 391 within a computer enclosure 390 is connected to a bus backplane 394 through a bus connector 392 and a power connector 393. Plug-in modules 395 are connected to bus back plane 394 through bus connectors 396.

Figure 22:
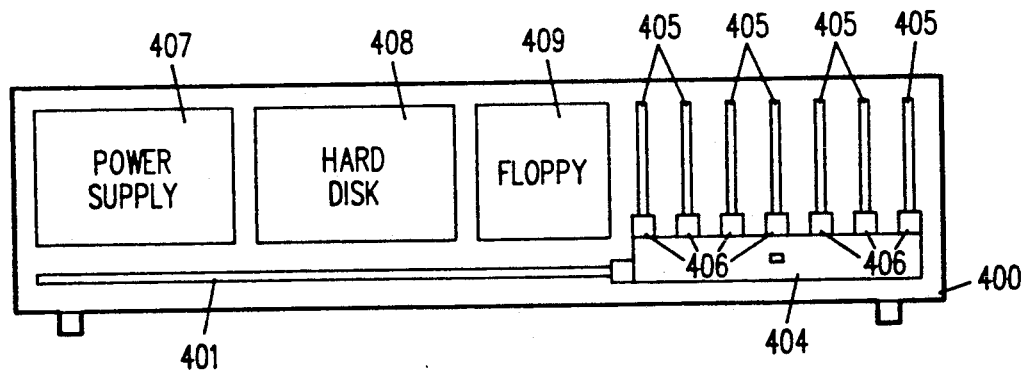

In FIG. 22, a mother board 401 within a computer enclosure 400 is connected to a bus backplane 404. Plug-in modules 405 are connected to bus back plane 404 through bus connectors 406. Also shown within computer enclosure 400 are a power supply 407, a hard disk 408 and a floppy disk 409.

Figure 23:
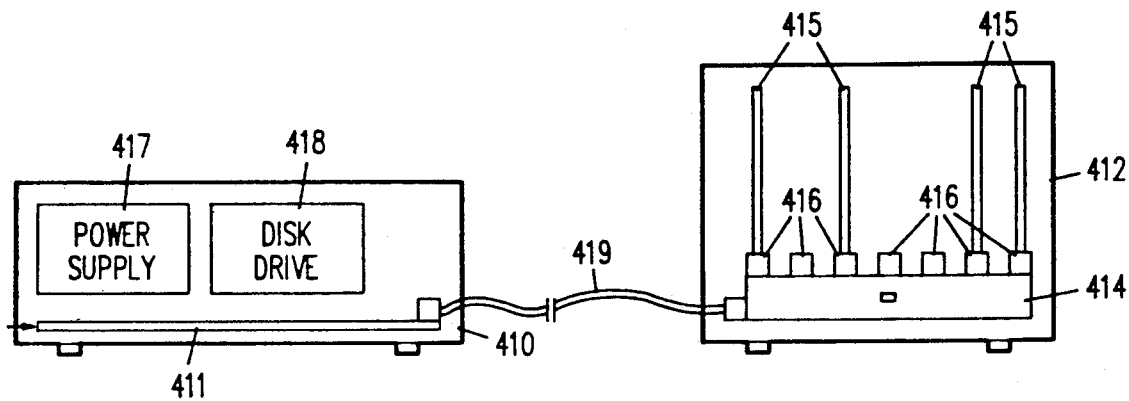

In FIG. 23, a mother board 411 is shown together with a power supply 417 and a disk drive 418 within a computer enclosure 410. Mother board 411 is connected to a bus backplane 414 within an extension box 412 through a flexible ribbon cable 419. Plug-in modules 415 are connected to bus back plane 414 through bus connectors 416.

Figure 24:
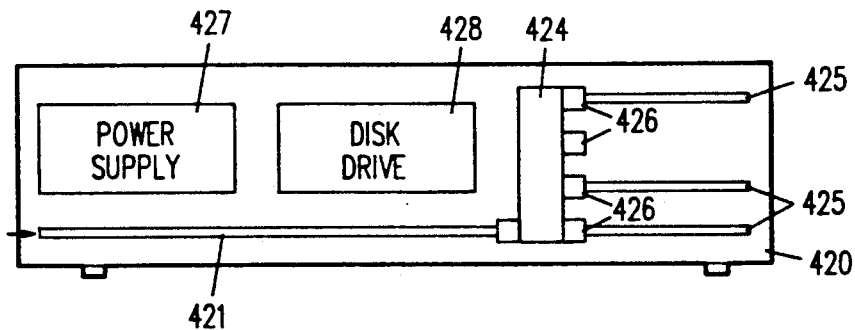

In FIG. 24, a mother board 421 within a computer enclosure 420 is connected to a bus backplane 424. Plug-in modules 425 are connected to bus back plane 424 through bus connectors 426. Also shown within computer enclosure 420 are a power supply 427 and a disk disk 428.

The present invention may be extended to other interconnection topologies besides a bus topology. For example, for the backplane shown in FIG. 5, a number of interconnection topologies may be implemented merely by replacing the bus chip on cards 90 through 107 with integrated circuits which include receivers, drivers and logic which implement other types of interconnection topologies.

Figure 25:
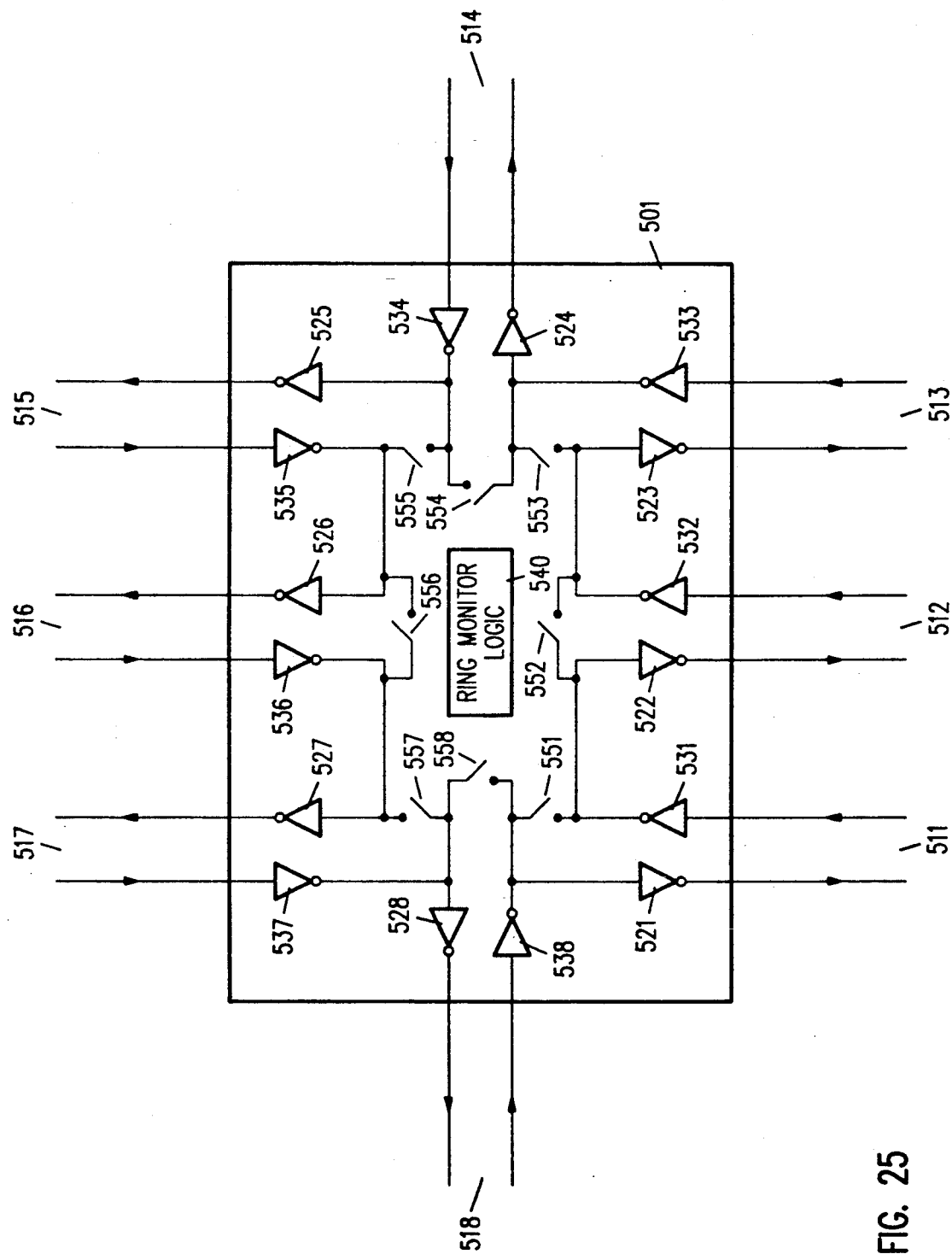
FIG. 25 shows a physical implementation of a ring topology in which interconnect receivers and interconnect drivers have been placed with ring monitor logic on an integrated circuit in accordance with an alternate preferred embodiment of the present invention.

FIG. 25, for instance, shows a physical layer implementation of one bit of a ring backplane on an integrated circuit 510. Modules are connected to the ring implemented on integrated circuit 501 through point-to-point link lines 511 through 518. Within integrated circuit 501, point-to-point link lines 511 through 518 interface with the ring through interconnect drivers 531 through 538 and through interconnect receivers 521 through 528.

In backplanes utilizing a ring topology, the output of one module is connected to the input of another module in a sequence such that all the modules are connected in series to form a ring. The data transmitted from one module may pass through many other modules before reaching the destination module. Some type of protocol, e.g., register insertion ring or token ring, is used for ring access, address and data transfer. Control information such as a destination address can be sent either as part of the data stream or by using a separate bit line or lines.

Ring topology can support higher data transfer rates and use bandwidth of broadcast media more efficiently than a bus due to inherent advantages of ring topology and ring protocols. Ring topology, therefore, is often used for interconnection in computer systems when bus topologies cannot support bandwidth requirements and thus the addition complexity of a ring topology and ring protocol is justified.

In addition to providing physical connection between modules, integrated circuit 501 can also include ring monitor logic 540 which performs functions such as automatic detection and bypassing of unplugged or inoperative modules using one of bypass switches 551 through 558, so that the ring is always closed and operative. Similarly, when a new module is plugged in, ring monitor logic 540 could detect this automatically and insert module into the ring by opening one of by pass switches 551 through 558.

Figure 26:
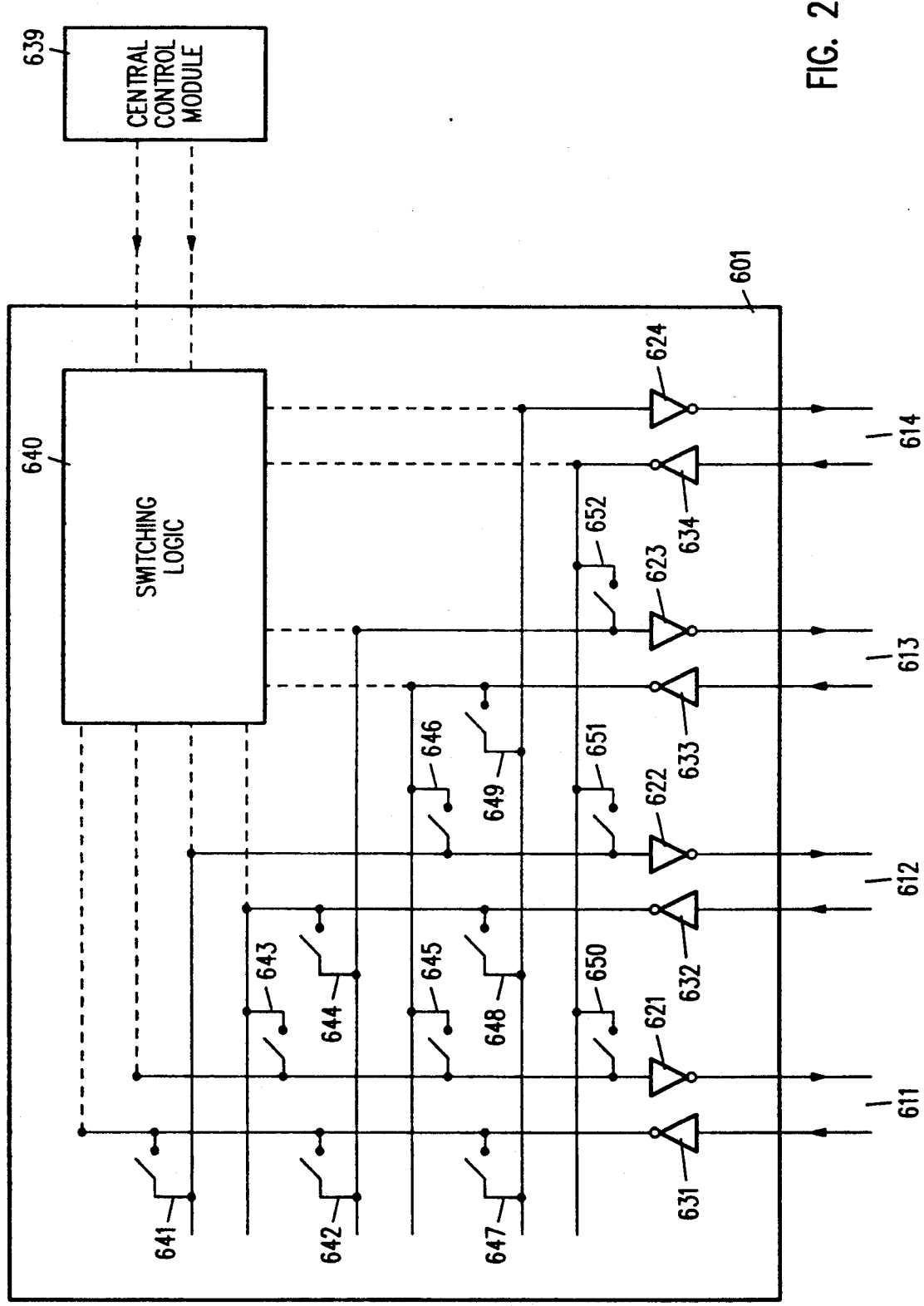
FIG. 26 shows a physical layer implementation of a circuit switched topology in which interconnect receivers and interconnect drivers have been placed with switching logic on an integrated circuit in accordance with another alternate preferred embodiment of the present invention.

FIG. 26 shows a physical layer implementation of one bit of a circuit switched backplane on an integrated circuit 610. Modules are connected to the circuit switch implemented on integrated circuit 601 through point-to-point link lines 611 through 614. Within integrated circuit 601, point-to-point link lines 611 through 614 interface with the circuit switch matrix through interconnect drivers 631 through 634 and through interconnect receivers 621 through 624.

Circuit switched interconnection schemes are used in high end computers and network switching nodes to allow for multiple simultaneous data exchanges between modules. For example, in multiprocessor systems that have a large number of processor—e.g., 64 processors or more—bus and ring topologies become inadequate because of limited bandwidth of the shared media. By establishing multiple simultaneous connections between pairs of modules, the bandwidth limitation is removed. However, using conventional approaches the circuit switched topology is an interconnection nightmare to implement because of the number of connections that have to go in and out of a central switch. For example, for a 16 module system with 64 bit wide busses, a central switch has to accommodate 2048 lines for a full duplex connection plus control signal lines such as a clock etc. However, using the present invention, each bit of the bus may be implemented on a separate integrated circuit resident on a card and requiring only 32 pins per chip independent of the width of the bus or the number of control lines.

Switching logic 640 controls switches 641 through 652 to provide multiple simultaneous data exchanges between modules based on information from the point-to-point links. Alternately, switches 641 through 652 may be controlled using a central control module 639, which is connected by a point-to-point link to each integrated circuit implementing one or more bits of the circuit switched topology. Other modules could communicate with the control module on separate bit lines using bus or ring protocol or by using dedicated lines from each module to the control module located on one or more cards on the backplane in order to establish or dismantle connections.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A bus backplane which electrically couples a plurality of modules, the bus backplane comprising:
at least one integrated circuit, each of the at least one integrated circuits including at least one bus line, and for each of the at least one bus line, each of the at least one integrated circuits including a plurality of bus receivers and bus drivers which provide a point-to-point link for each of the plurality of modules.

2. A bus backplane as in claim 1 wherein the at least one integrated circuit each are resident on a card, the cards being coupled to the modules so that the cards form a stack.

3. A bus chip which implements communication between a plurality of modules, the bus chip comprising:
a bus line;
a plurality of bus driver/receiver means, coupled to the bus line, each bus driver/receiver means for a providing point-to-point link between a module from the plurality of modules and the bus line.

4. A bus chip as in claim 3 wherein each bus driver/receiver means includes:
bus driver means, electrically coupled by a first point-to-point link line to a transmit latch of an associated module from the plurality of modules, for driving the bus line based on an output of the transmit latch; and
bus receiver means, electrically coupled by a second point-to-point link line to a receive latch of the associated module, for receiving a value on the bus line and forwarding the value to the receive latch.

5. A bus chip as in claim 3 wherein each bus driver/receiver means is tri-level and includes:
bus driver means, electrically coupled by a point-to-point link line to a transmit latch of an associated module from the plurality of modules, for driving the bus line based on an output of the transmit latch; and
bus receiver means, electrically coupled by the point-to-point link line to a receive latch of the associated module, for receiving a value on the bus line and forwarding the value to the receive latch;
wherein the bus driver means responds only to data on an output of the transmit latch, and the receive latch responds only to data from the bus receiver means.

6. A bus chip as in claim 3 wherein the bus chip additionally includes:
a second bus line;
a second plurality of bus driver/receiver means, coupled to the second bus line, each bus driver/receiver means from the second plurality of bus driver/receiver means for providing a point-to-point link between a module from the plurality of modules and the second bus line.

7. A bus chip as in claim 6 wherein each bus driver/receiver means from the second plurality of bus driver/receiver means is tri-level and includes:
bus driver means, electrically coupled by a point-to-point link line to a transmit latch of an associated module from the plurality of modules, for driving the second bus line based on an output of the transmit latch; and
bus receiver means, electrically coupled by the point-to-point link line to a receive latch of the associated module, for receiving a value on the second bus line and forwarding the value to the receive latch.

8. A bus backplane which electrically couples a plurality of modules, the bus backplane comprising:
a plurality of integrated circuits, each of the plurality of integrated circuits including at least one bus line, and for each of the at least one bus line, the plurality of integrated circuits including a plurality of bus receivers and bus drivers which provide a point-to-point link to each of the plurality of modules.

9. A bus backplane as in claim 8 additionally comprising a plurality of point-to-point link lines connecting the plurality of modules to the plurality of integrated circuits wherein all point-to-point link lines from the plurality of point-to-point link lines are of equal length.

10. A bus backplane as in claim 8 wherein the plurality of integrated circuit are resident on a plurality of cards, the cards being stacked in a first direction to form a stack of cards.

11. A bus backplane as in claim 10 wherein the modules are connected around the stack of cards in a star formation, each module being oriented in a plane which is parallel to the first direction and perpendicular to each card in the stack of cards.

12. A bus backplane as in claim 11 additionally comprising a plurality of point-to-point link lines connecting the plurality of modules to the plurality of integrated circuits wherein all point-to-point link lines from the plurality of point-to-point link lines are of equal length.

13. A bus backplane as in claim 10 wherein the modules are connected to the cards so that the modules are in two stacks on two sides of the stack of cards, each module being oriented in a plane which is parallel to the first direction and perpendicular to each card in the stack of cards.

14. A bus backplane as in claim 10 wherein each integrated circuit is mounted in a hole in one of the plurality of cards.

15. A bus backplane as in claim 10 wherein, except for an integrated circuit on a card which is on top of the stack of cards, each integrated circuit extends through a hole in a next card above a card on which the integrated circuit is mounted.

16. A bus backplane as in claim 10 wherein a die for each integrated circuit is mounted and covered by epoxy on a card from the plurality of cards.

17. A method for providing for data communication between a plurality of modules, the method comprising the steps of:
(a) providing a plurality of bus lines within at least one integrated circuit;
(b) connecting the plurality of modules to the plurality of bus lines through point-to-point links implemented using bus drivers and bus receivers included within the at least one integrated circuit and which provide an electrical interface between the plurality of bus lines and the plurality of modules.

18. A method as in claim 17 wherein the point-to-point links include a plurality of point-to-point link lines wherein all point-to-point link lines from the plurality of point-to-point link lines are of equal length.

19. A method as in claim 17 wherein the at least one integrated circuit are each resident on at least one card, the at least one card being stacked in a first direction to form a card stack.

20. A method as in claim 19 wherein step (b) includes coupling the modules to the card stack so that the modules are around the card stack in a star formation, each module being oriented in a plane which is parallel to the first direction and perpendicular to each card in the card stack.

21. A method as in claim 19 wherein step (b) includes coupling the modules to the card stack so that the modules are in two stacks on two sides of the card stack, each module being oriented in a plane which is parallel to the first direction and perpendicular to each card in the card stack.

22. A backplane which electrically couples a plurality of modules, the backplane coupling the modules together with a multi-bit interconnection topology, the backplane comprising:
a plurality of integrated circuits, each integrated circuit in the plurality of integrated circuits including at least a one bit implementation of the interconnection topology, and for each of the at least one bit implementation, each of the integrated circuits including a plurality of interconnected receivers and interconnect drivers which provide a point-to-point link for each of the plurality of modules.

23. A backplane as in claim 22 wherein each of the integrated circuits are resident on a card, the cards being coupled to the modules so that the cards form a stack.

24. A backplane as in claim 22 wherein the interconnection topology is a bus topology.

25. A backplane as in claim 22 wherein the interconnection topology is a ring topology.

26. A backplane as in claim 22 wherein the interconnection topology is a circuit switched topology.

27. A backplane which electrically couples a plurality of modules, the backplane comprising:
a plurality of integrated circuits, each of the plurality of integrated circuits including at least one bit of an interconnection topology, and for each of the at least one bit of the interconnection topology, the plurality of integrated circuits including a plurality of interconnect receivers and interconnect drivers which provide a point-to-point link to each of the plurality of modules.

28. A backplane as in claim 27 additionally comprising a plurality of point-to-point link lines connecting the plurality of modules to the plurality of integrated circuits wherein all point-to-point link lines from the plurality of point-to-point link lines are of equal length.

29. A backplane as in claim 27 wherein the plurality of integrated circuit are resident on a plurality of cards, the card being stacked in a first direction to form a stack of cards.

30. A backplane as in claim 29 wherein the interconnection topology is a bus topology.

31. A backplane as in claim 29 wherein the interconnection topology is a ring topology.

32. A backplane as in claim 29 wherein the interconnection topology is a circuit switched topology.

33. A method for providing for data communication between a plurality of modules, the method comprising the steps of:
(a) providing a physical layer implementation of a multi-bit interconnection topology within a plurality of integrated circuits, each of the plurality of integrated circuits including at least a one bit implementation of the interconnection topology;
(b) connecting the plurality of modules to the physical layer implementation of the interconnection topology through point-to-point links implemented using interconnect drivers and interconnect receivers included within the plurality of integrated circuits and which provide an electrical interface between the physical layer implementation of the interconnection topology and the plurality of modules.

34. A method as in claim 33 wherein the point-to-point links include a plurality of point-to-point link lines wherein all point-to-point link lines from the plurality of point-to-point link lines are of equal length.

35. A method as in claim 33 wherein the each of the plurality of integrated circuits are resident on on a separate card from a plurality of cards, the plurality of cards being stacked in a first direction to form a card stack.

36. A method as in claim 35 wherein step (b) includes coupling the modules around the card stack in a star formation, each module being oriented in a plane which is parallel to the first direction and perpendicular to each card in the card stack.

37. A backplane as in claim 35 wherein the interconnection topology is a bus topology.

38. A backplane as in claim 35 wherein the interconnection topology is a ring topology.

39. A backplane as in claim 35 wherein the interconnection topology is a circuit switched topology.

* * * * *